US006861752B2

(12) United States Patent
Kajiyama

(10) Patent No.: US 6,861,752 B2
(45) Date of Patent: Mar. 1, 2005

(54) SEMICONDUCTOR DEVICE HAVING WIRING LINE WITH HOLE, AND MANUFACTURING METHOD THEREOF

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/357,357

(22) Filed: Feb. 4, 2003

(65) Prior Publication Data

US 2003/0146515 A1 Aug. 7, 2003

(30) Foreign Application Priority Data

Feb. 5, 2002 (JP) ........................................ 2002-028561

(51) Int. Cl.[7] .......................... H01L 23/48; H01L 23/52; H01L 29/40
(52) U.S. Cl. ........................ 257/758; 257/748; 257/750; 257/759; 257/760
(58) Field of Search ................................ 257/758, 759, 257/760, 748, 750

(56) References Cited

U.S. PATENT DOCUMENTS

| 3,953,664 | A | * | 4/1976 | Tsunashima | ................. | 174/264 |
|---|---|---|---|---|---|---|
| 4,878,155 | A | * | 10/1989 | Conley | ......................... | 361/761 |
| 5,036,301 | A | * | 7/1991 | Takao et al. | ................. | 333/185 |
| 5,121,127 | A | * | 6/1992 | Toriyama | ............. | 343/700 MS |
| 5,140,110 | A | * | 8/1992 | Nakagawa et al. | ......... | 174/250 |
| 5,150,086 | A | * | 9/1992 | Ito | ............................. | 333/182 |
| 5,382,540 | A | * | 1/1995 | Sharma et al. | .............. | 438/259 |
| 5,439,848 | A | * | 8/1995 | Hsu et al. | .................... | 438/151 |
| 5,446,311 | A | * | 8/1995 | Ewen et al. | ................ | 257/531 |
| 5,468,997 | A | * | 11/1995 | Imai et al. | ................... | 257/734 |
| 5,757,072 | A | * | 5/1998 | Gorowitz et al. | ........... | 257/700 |
| 5,760,429 | A | * | 6/1998 | Yano et al. | ................. | 257/211 |
| 6,246,118 | B1 | * | 6/2001 | Buynoski | .................... | 257/758 |
| 6,297,563 | B1 | * | 10/2001 | Yamaha | ...................... | 257/781 |
| 2002/0074660 | A1 | * | 6/2002 | Fukasawa | .................... | 257/758 |
| 2002/0118523 | A1 | * | 8/2002 | Okabe et al. | ............... | 361/793 |
| 2002/0136053 | A1 | * | 9/2002 | Asano et al. | ............... | 365/158 |
| 2002/0190291 | A1 | * | 12/2002 | Hosotani | ..................... | 257/295 |
| 2003/0173673 | A1 | * | 9/2003 | Val | ............................. | 257/758 |

FOREIGN PATENT DOCUMENTS

JP 2000-163950 6/2000

* cited by examiner

Primary Examiner—Amir Zarabian
Assistant Examiner—Ida M. Soward
(74) Attorney, Agent, or Firm—Oblon, Spivak, McClelland, Maier & Neustadt, P.C.

(57) ABSTRACT

A semiconductor device includes a first wiring line having a first through hole, and a first connection member which extends through the first through hole at an interval from the first wiring line.

36 Claims, 20 Drawing Sheets

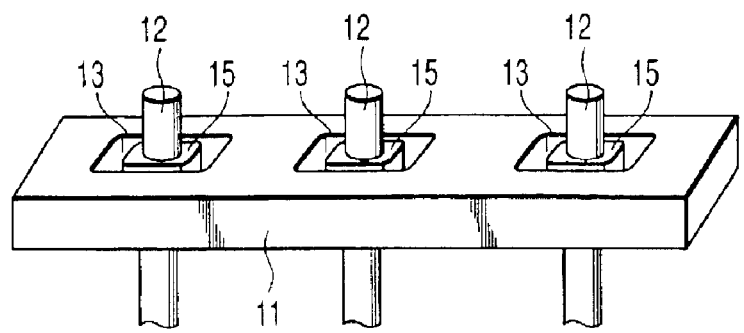
F I G. 7A
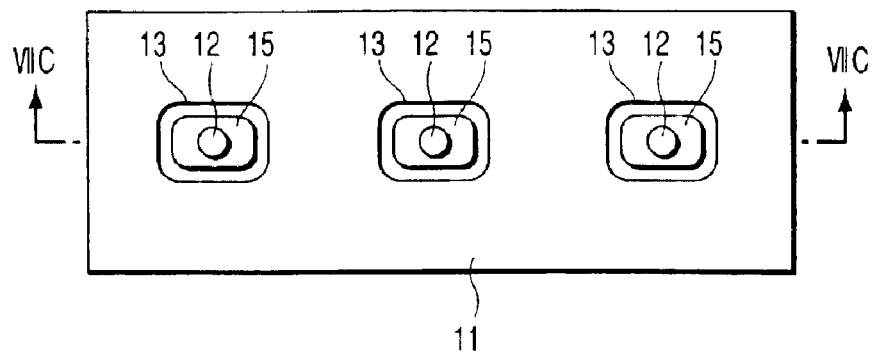
F I G. 7B
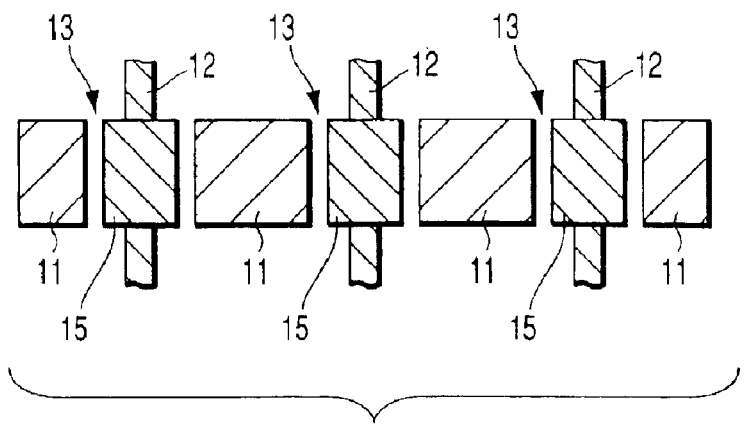
F I G. 7C

US 6,861,752 B2

SEMICONDUCTOR DEVICE HAVING WIRING LINE WITH HOLE, AND MANUFACTURING METHOD THEREOF

CROSS-REFERENCE TO RELATED APPLICATIONS

This application is based upon and claims the benefit of priority from the prior Japanese Patent Application No. 2002-028561, filed Feb. 5, 2002, the entire contents of which are incorporated herein by reference.

BACKGROUND OF THE INVENTION

1. Field of the Invention

The present invention relates to a semiconductor device having a thick wiring line with a hole, and a manufacturing method thereof.

2. Description of the Related Art

As shown in FIG. 22, a semiconductor device with a multilayered structure sometimes requires thick wiring lines 111 and 112 in order to supply a large current. Wiring lines which are electrically isolated from the thick wiring lines 111 and 112, particularly vertical wiring lines such as vias 113 may be interposed between the thick wiring lines 111 and 112. In this case, as shown in FIG. 23, a wiring width X of the thick wiring lines 111 and 112, a width Y of the via 113, an alignment margin for a distance Z between the thick wiring line 111 or 112 and the via 113, and the like together increase the area of the semiconductor device.

Even a magnetic memory device such as an MRAM (Magnetic Random Access Memory) having an MTJ (Magnetic Tunnel Junction) element utilizing the tunnel magneto-resistance (to be referred to as TMR hereinafter) requires a thick wiring line at a given portion, and suffers the same problem as that of the semiconductor device.

That is, as shown in FIG. 24, in the magnetic memory device, an MTJ element 130 as a memory element is arranged at the intersection of a bit line 127 and word line 136, and data is written in the MTJ element 130. In write, a large current must be supplied to the bit line 127 and word line 136. For this purpose, the wiring widths of the bit line 127 and word line 136 must be thick to a certain degree.

In general, as shown in FIG. 25, the bit line 127 and word line 136 as write wiring lines must cover the MTJ element 130. The MTJ element 130 is often elongated for optimization of the magnetic domain. When the MTJ element 130 is elongated in a direction (direction indicated by an arrow) in which the word line 136 runs, a wiring width Q of the bit line 127 must be made large in accordance with a width P of the MTJ element 130.

In this manner, the device area also increases in the magnetic memory device owing to large wiring widths of the bit line 127 and word line 136, similar to the semiconductor device.

BRIEF SUMMARY OF THE INVENTION

A semiconductor device according to the first aspect of the present invention comprises a first wiring line having a first through hole, and a first connection member which extends through the first through hole at an interval from the first wiring line.

A semiconductor device manufacturing method according to the second aspect of the present invention comprises forming a first wiring line having a first through hole, and forming a first connection member which extends through the first through hole at an interval from the first wiring line.

BRIEF DESCRIPTION OF THE SEVERAL VIEWS OF THE DRAWING

FIG. 7A is a perspective view showing a wiring line and contact according to the second embodiment of the present invention;

FIG. 7B is a plan view showing the wiring line and contact according to the second embodiment of the present invention;

FIG. 7C is a sectional view taken along the line VIIC—VIIC in FIG. 7B;

DETAILED DESCRIPTION OF THE INVENTION

Figure 1:
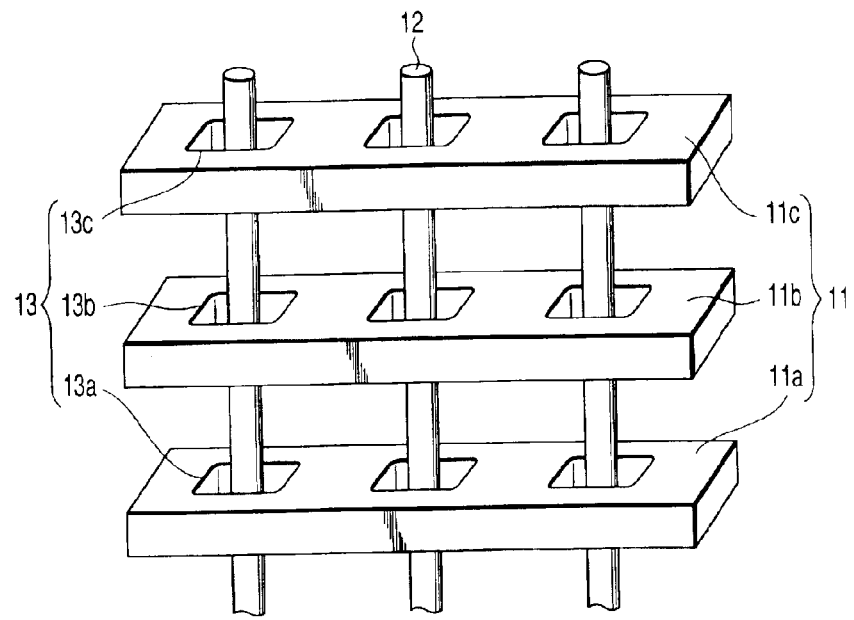
FIG. 1 is a perspective view showing a semiconductor device with a multilayered structure according to the first embodiment of the present invention.

Preferred embodiments of the present invention will be described below with reference to several views of the accompanying drawing. In the following description, the same reference numerals denote the same parts throughout the drawing.

First Embodiment

In the first embodiment, a hole is formed in a thick wiring line, and a contact which is electrically isolated from a wiring line extends through the hole.

Figure 2A:
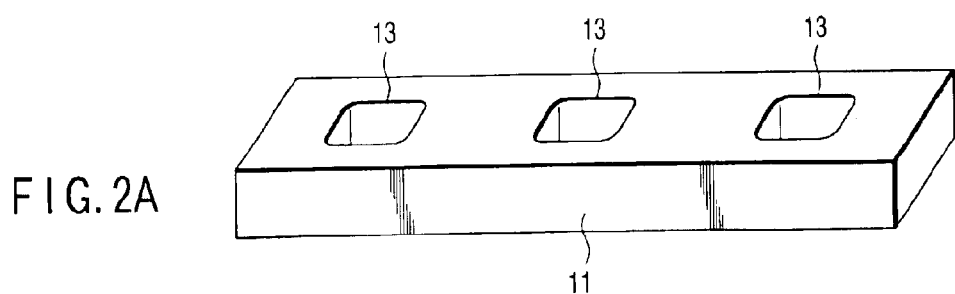
FIG. 2A is a perspective view showing a wiring line according to the first embodiment of the present invention.
Figure 2B:
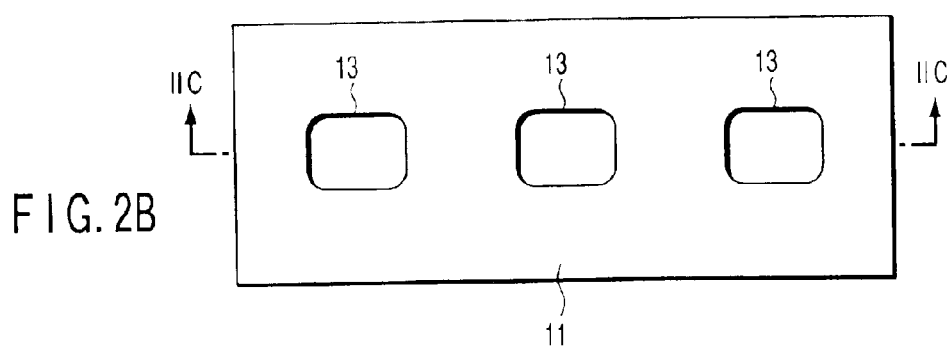
FIG. 2B is a plan view showing the wiring line according to the first embodiment of the present invention.
Figure 2C:
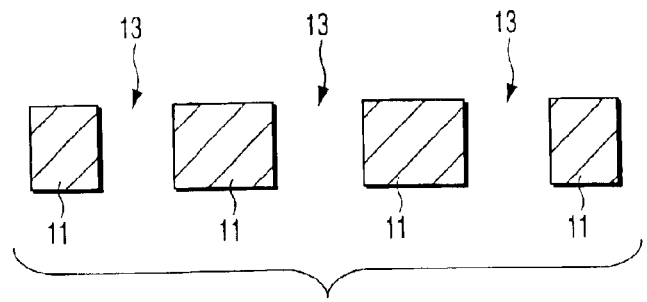
FIG. 2C is a sectional view taken along the line IIC—IIC in FIG. 2B.
Figure 3A:
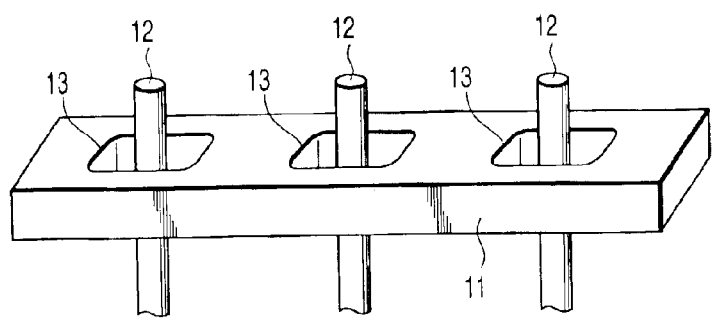
FIG. 3A is a perspective view showing a wiring line and contact according to the first embodiment of the present invention.
Figure 3B:
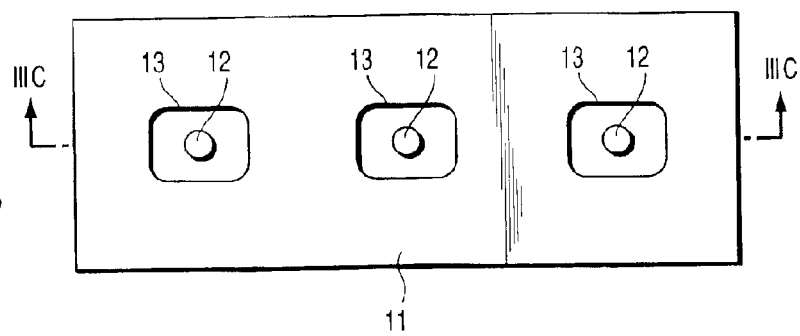
FIG. 3B is a plan view showing the wiring line and contact according to the first embodiment of the present invention.
Figure 3C:
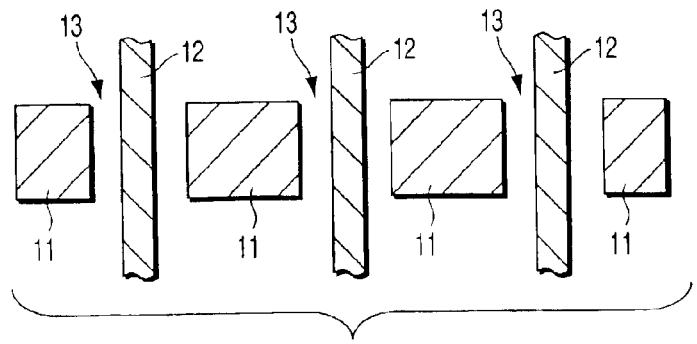
FIG. 3C is a sectional view taken along the line IIIC—IIIC in FIG. 3B.

FIG. 1 is a perspective view showing a semiconductor device with a multilayered structure according to the first embodiment of the present invention. FIGS. 2A, 2B, and 2C are a perspective view, plan view, and sectional view, respectively, showing a wiring line according to the first embodiment of the present invention. FIGS. 3A, 3B, and 3C are a perspective view, plan view, and sectional view, respectively, showing a wiring line and contact according to the first embodiment of the present invention. The structure of the semiconductor device according to the first embodiment will be described.

When the semiconductor device with the multilayered structure according to the first embodiment has first, second, and third wiring lines 11a, 11b, and 11c with a large wiring width, and vertical wiring lines such as contacts 12 which are electrically isolated from the first, second, and third wiring lines 11a, 11b, and 11c, as shown in FIG. 1, holes 13a, 13b, and 13c are formed in the first, second, and third wiring lines 11a, 11b, and 11c. The contacts 12 extend through these holes 13a, 13b, and 13c.

More specifically, as shown in FIGS. 2A, 2B, and 2C, a plurality of holes 13 are formed in, e.g., a wiring line 11 with a large wiring width to which a large current must be supplied. The holes 13 extend through the wiring line 11, and are spaced apart from each other at, e.g., an equal interval. The shape of the hole 13 is not particularly limited, and is, e.g., a rectangle or circle.

As shown in FIGS. 3A, 3B, and 3C, the contact 12 extends through the hole 13 of the wiring line 11. To electrically isolate the contact 12 from the wiring line 11, the contact 12 and wiring line 11 are arranged apart from each other. For example, an insulating film (not shown) is buried between the contact 12 and the wiring line 11.

The width of the wiring line 11 substantially decreases at the portion of the hole 13, and the wiring resistance may increase. Hence, the hole 13 must be set to a size small enough not to increase the wiring resistance.

The semiconductor device according to the first embodiment of the present invention is formed by the following method. A method of manufacturing part of the semiconductor device according to the first embodiment will be explained briefly.

As shown in FIG. 2C, a wiring material for the wiring line 11 is formed and patterned into the shapes of the wiring line 11 and hole 13 by using, e.g., lithography and RIE (Reactive Ion Etching). An insulating film (not shown) is formed in the hole 13 and on the wiring line 11. Part of the insulating film is then removed to form a groove for the contact 12 in the hole 13. A contact material is buried in the groove to form a contact 12 which passes through the hole 13, as shown in FIG. 3C.

The above process is repeated to form multilayered wiring. As shown in FIG. 1, the contact 12 which passes through the holes 13a, 13b, and 13c in the first, second, and third wiring lines 11a, 11b, and 11c is formed.

In the first embodiment, when multilayered wiring which requires a large wiring width is to be formed, the hole 13 is formed in the wiring line 11 with a large wiring width, and the contact 12 extends through the hole 13 at an interval from the wiring line 11. The device area is therefore determined by only the width of the wiring line 11, and an increase in device area can be minimized, which is advantageous to micropatterning.

In general, a wiring line to which a large current is supplied is not arranged on the lower layer of multilayered wiring, but is often arranged on the uppermost layer because the wiring increases the occupied area. However, the use of the structure according to the first embodiment can reduce the occupied area, and the wiring line 11 to which a large current is supplied can be arranged even on the lower layer of multilayered wiring.

Figure 4:
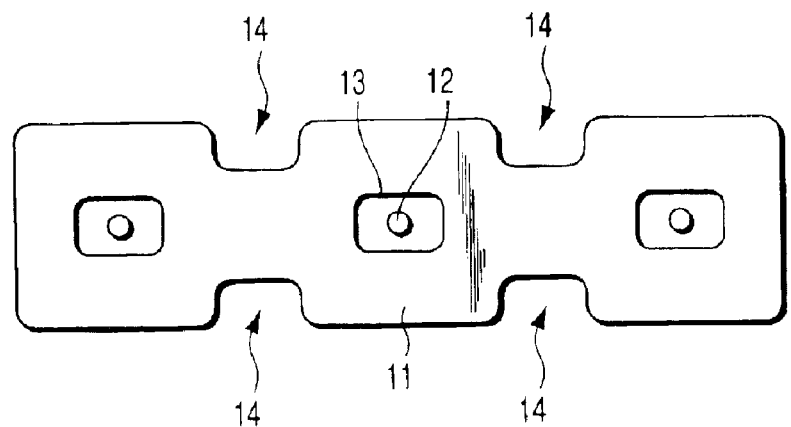
FIG. 4 is a plan view showing a wiring line with a recess according to the first embodiment of the present invention.

In the first embodiment, the wiring line 11 is not limited to the above-mentioned pattern and can be variously modified. For example, as shown in FIG. 4, a recess 14 may be formed between adjacent holes 13 in the wiring line 11 by decreasing the width of the wiring line 11. In this case, the current path can be adjusted in addition to the effects of the first embodiment.

Second Embodiment

In the second embodiment, a contact fringe is formed in a hole in the wiring line according to the first embodiment. Only a difference of the second embodiment from the first embodiment will be described.

Figure 5:
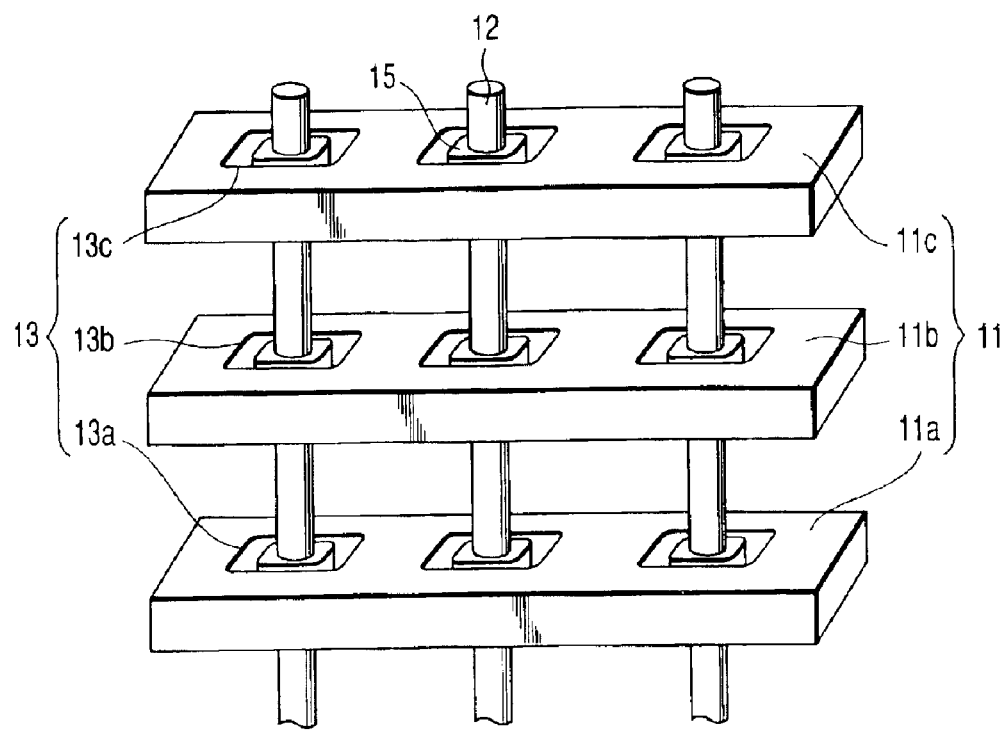
FIG. 5 is a perspective view showing a semiconductor device with a multilayered structure according to the second embodiment of the present invention.
Figure 6A:
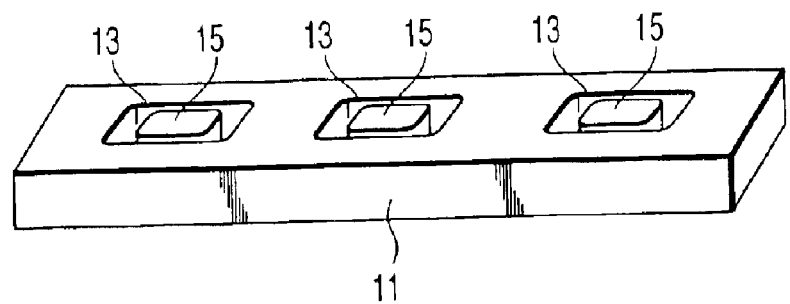
FIG. 6A is a perspective view showing a wiring line according to the second embodiment of the present invention.
Figure 6B:
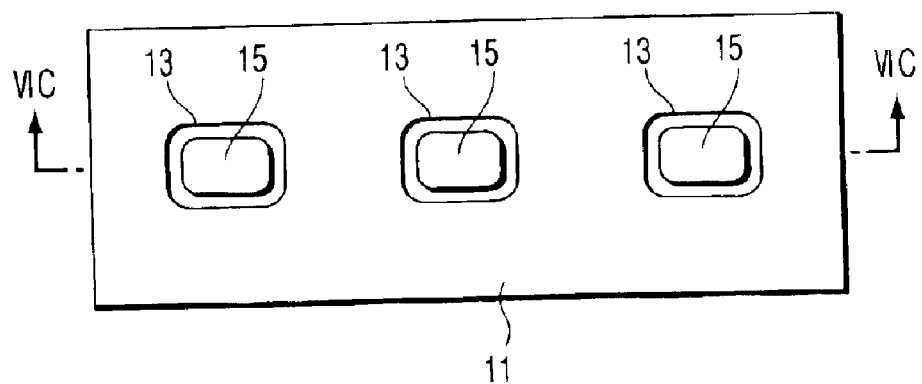
FIG. 6B is a plan view showing the wiring line according to the second embodiment of the present invention.
Figure 6C:
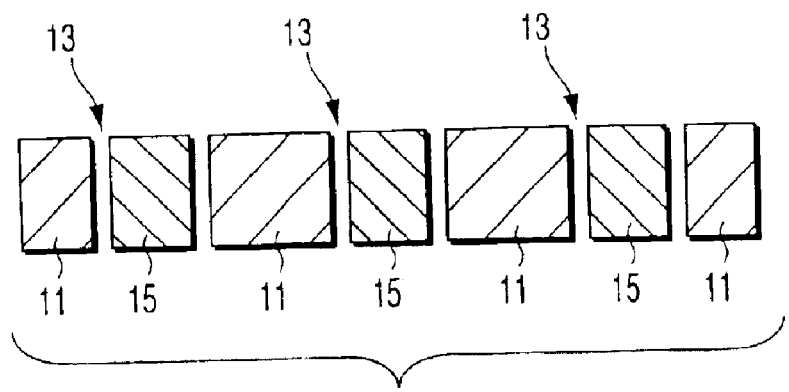
FIG. 6C is a sectional view taken along the line VIC—VIC in FIG. 6B.

FIG. 5 is a perspective view showing a semiconductor device with a multilayered structure according to the second embodiment of the present invention. FIGS. 6A, 6B, and 6C are a perspective view, plan view, and sectional view, respectively, showing a wiring line according to the second embodiment of the present invention. FIGS. 7A, 7B, and 7C are a perspective view, plan view, and sectional view, respectively, showing a wiring line and contact according to the second embodiment of the present invention. The structure of the semiconductor device according to the second embodiment will be described.

The second embodiment is different from the first embodiment in that a contact fringe 15 is arranged for a contact 12 in a hole 13 of a wiring line 11, as shown in FIGS. 5 to 7C. The contact fringe 15 is formed from the same material as the wiring line 11, and the contact fringe 15 and wiring line 11 are equal in thickness. The contact fringe 15 is arranged apart from the wiring line 11.

The semiconductor device according to the second embodiment of the present invention is formed by the following method. A method of manufacturing part of the semiconductor device according to the second embodiment will be explained briefly.

As shown in FIG. 6C, a wiring material for the wiring line 11 is formed and patterned into the shapes of the hole 13 and contact fringe 15 by using, e.g., lithography and RIE. An insulating film (not shown) is formed at the gap between the contact fringe 15 and the wiring line 11 and on the wiring line 11. Part of the insulating film is then removed to form a groove for the contact 12 in which the contact fringe 15 is exposed. A contact material is buried in the groove to form a contact 12 connected to the contact fringe 15, as shown in FIG. 7C.

The above process is repeated to form multilayered wiring. As shown in FIG. 5, the contact 12 which has the contact fringe 15 and passes through holes 13a, 13b, and 13c in first, second, and third wiring lines 11a, 11b, and 11c is formed.

The second embodiment can obtain not only the same effects as those of the first embodiment but also the following effects.

In the first embodiment, the contact 12 is so formed as to extend through the hole 13. The depth of the groove for the contact 12 is the sum of the thickness of the wiring line 11 and the distance between upper and lower wiring lines. In the second embodiment, the contact 12 is formed on the contact fringe 15, and the depth of the groove for the contact 12 is determined by only the distance between upper and lower grooves. The second embodiment need not form a deep contact 12, unlike the first embodiment, and the contact 12 can be formed with the same depth as that of a contact which connects general wiring lines. Thus, the second embodiment can adopt a general contact process and prevent voids which may be generated in formation of a deep contact.

Figure 8:
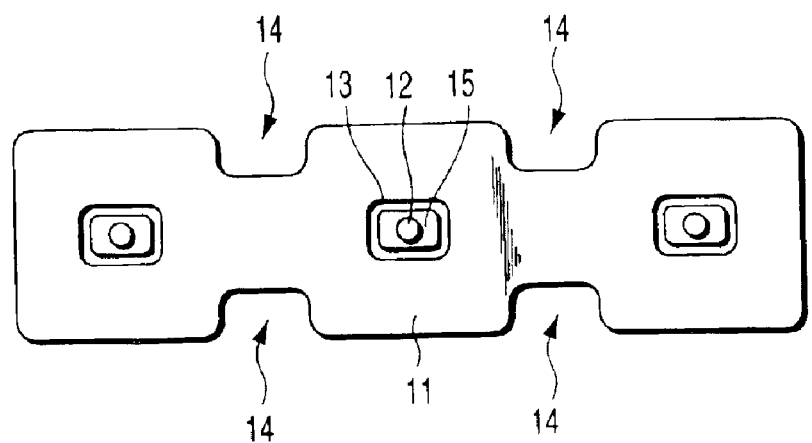
FIG. 8 is a plan view showing a wiring line with a recess according to the second embodiment of the present invention.

In the second embodiment, the wiring line 11 is not limited to the above-mentioned pattern and can be variously modified. For example, as shown in FIG. 8, a recess 14 may be formed between adjacent holes 13 in the wiring line 11. In this case, the current path can be adjusted in addition to the effects of the second embodiment.

Third Embodiment

In the third embodiment, the structure of the semiconductor device according to the second embodiment is applied to a magnetic memory device. The magnetic memory device is an MRAM (Magnetic Random Access Memory) having an MTJ (Magnetic Tunnel Junction) element utilizing the tunnel magneto-resistance (to be referred to as TMR hereinafter). In the MRAM structure according to the third embodiment, the MTJ element is arranged at the intersection of a bit line and write word line.

Figure 9:
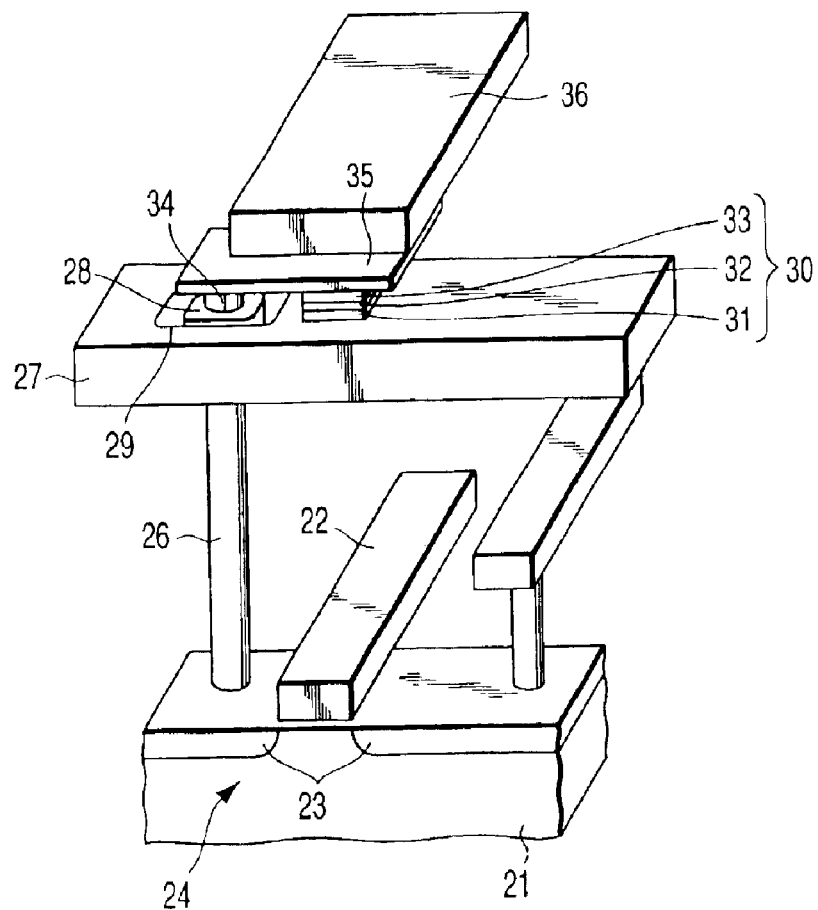
FIG. 9 is a perspective view showing a magnetic memory device according to the third embodiment of the present invention.
Figure 10:
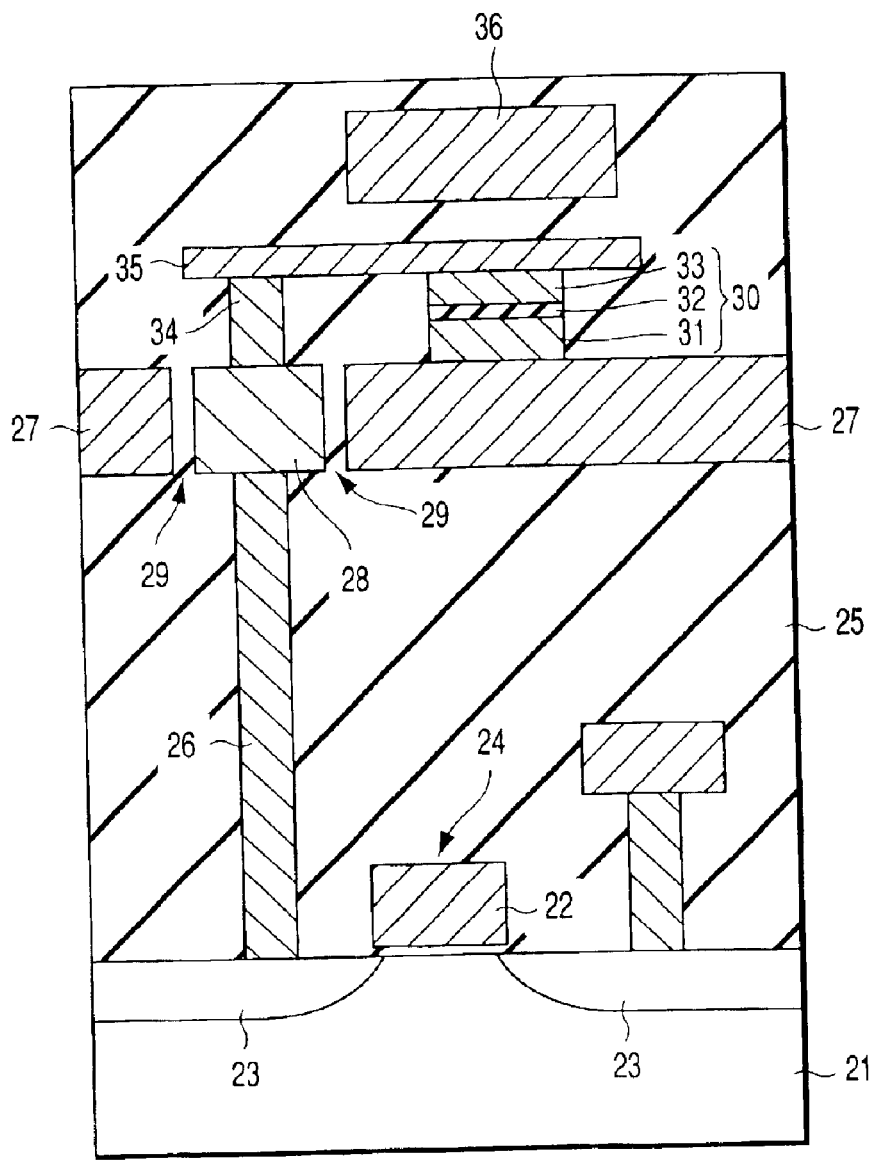
FIG. 10 is a sectional view showing the magnetic memory device according to the third embodiment of the present invention.

FIG. 9 is a perspective view showing the magnetic memory device according to the third embodiment of the present invention. FIG. 10 is a sectional view showing the magnetic memory device according to the third embodiment of the present invention. The structure of the magnetic memory device according to the third embodiment will be explained.

As shown in FIGS. 9 and 10, in the magnetic memory device according to the third embodiment, a bit line 27 and write word line 36 cross each other. An MTJ element 30 is arranged on the bit line 27 at the intersection of the bit line 27 and write word line 36. A hole 29 is formed in the bit line 27, and a contact fringe 28 is arranged in the hole 29. An upper wiring line 35 connected to the MTJ element 30 is connected to a contact 34, and the contact 34 is connected to the contact fringe 28. The contact fringe 28 is connected to a contact 26, and the contact 26 is connected to a source/drain diffusion layer 23 of a MOS transistor 24. Hence, the MTJ element 30 is connected to the data read MOS transistor 24 via the bit line 27 and hole 29.

The magnetic memory device according to the third embodiment of the present invention is formed by the following method. A method of manufacturing the magnetic memory device according to the third embodiment will be explained briefly.

A gate electrode 22 is selectively formed on a semiconductor substrate 21, and source and drain diffusion layers 23 are formed in the semiconductor substrate 21 on the two sides of the gate electrode 22, forming a MOS transistor 24. The gate electrode 22 of the MOS transistor 24 serves as a read word line.

A contact 26 to be connected to the source/drain diffusion layer 23 is formed in an insulating film 25. A wiring material for the bit line 27 and contact fringe 28 is formed and patterned. As a result, a bit line 27 having a hole 29 is formed, and a contact fringe 28 is also formed in the hole 29. The bit line 27 and contact fringe 28 have a gap between them, and are electrically isolated from each other.

An MTJ element 30 is formed on the bit line 27. The MTJ element 30 is made up of a magnetically fixed layer (magnetic pinning layer) 31, a magnetic recording layer (magnetic free layer) 33, and a tunnel junction layer 32 between the magnetically fixed layer 31 and the magnetic recording layer 33.

A contact 34 is formed on the contact fringe 28, and an upper wiring line 35 is formed on the contact 34 and MTJ element 30. A write word line 36 is formed apart from the upper wiring line 35 above the MTJ element 30.

The magnetic memory device according to the third embodiment of the present invention writes and reads out data by the following operation. Write and read of the magnetic memory device according to the third embodiment will be described briefly.

To write data in the MTJ element 30, the bit line 27 and write word line 36 are selected. A current is supplied to the bit line 27 and write word line 36 to generate current magnetic fields. A combined magnetic field of the current magnetic fields generated by the bit line 27 and write word line 36 is applied to the MTJ element 30. Data "1" or "0" is then written in the MTJ element 30.

To read out data written in the MTJ element 30, the MOS transistor 24 connected to the MTJ element 30 is turned on. A current is supplied to the MTJ element 30, upper wiring line 35, contact 34, contact fringe 28, contact 26, and source/drain diffusion layer 23. The resistance value of the MTJ element 30 is read, and data "1" or "0" is determined.

Similar to the first embodiment, the third embodiment can reduce the device area, which is advantageous to micropatterning. That is, in the magnetic memory device, write wiring lines (bit line 27 and word line 36) used to write data in the MTJ element 30 become thick in order to supply a large current. Even in this case, the hole 29 is formed in the bit line 27, and the contacts 34 and 26 extend through the hole 29 at an interval from the bit line 27. This can reduce the occupied area of the memory cell portion by the occupied areas of the contacts 34 and 26, the alignment margin, and the like.

Similar to the second embodiment, the third embodiment uses the contact fringe 28. The third embodiment can, therefore, adopt a general contact process and prevent voids which may be generated in formation of a deep contact.

Figure 24:
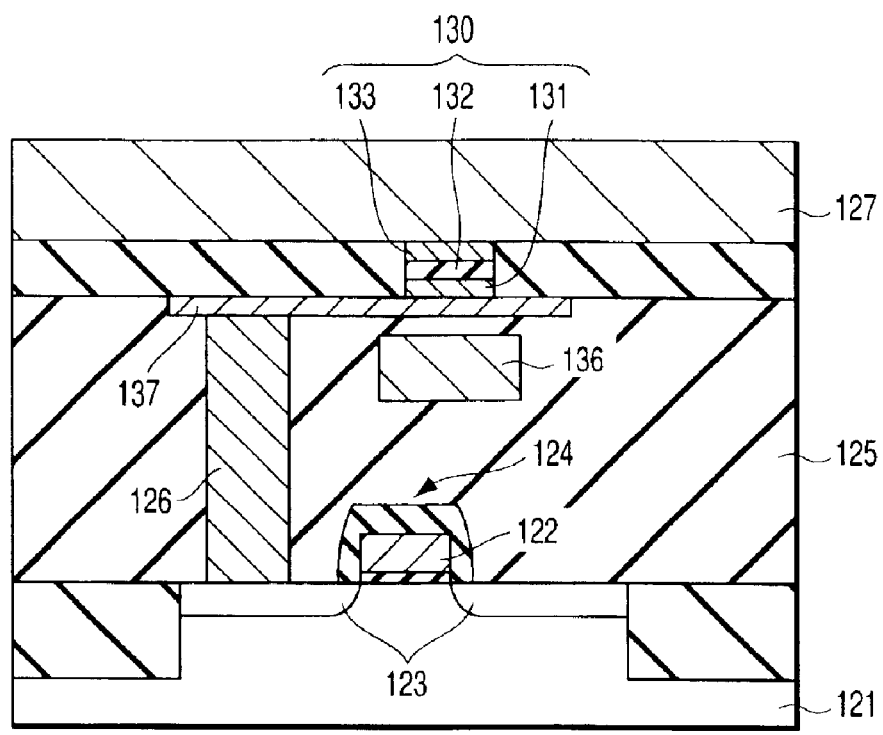
FIG. 24 is a sectional view showing a conventional magnetic memory device.
Figure 25:
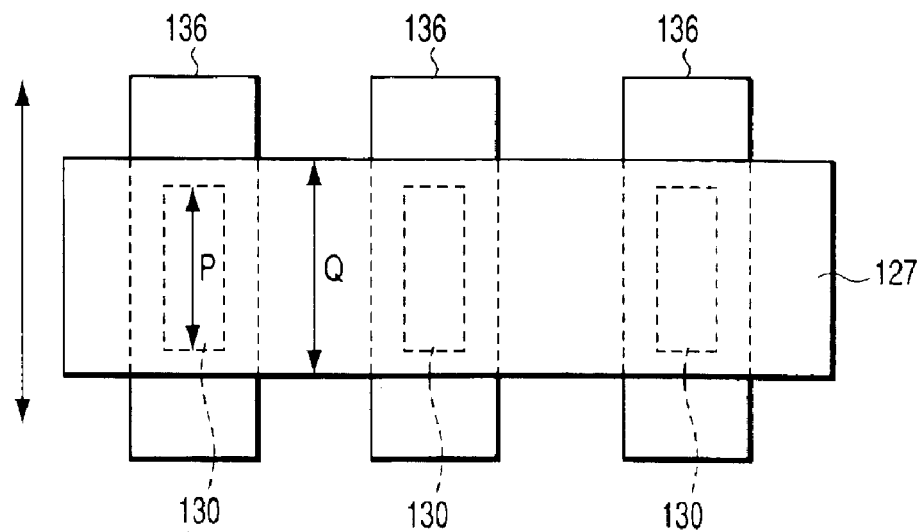
FIG. 25 is a plan view showing the conventional magnetic memory device.

In the magnetic memory device according to the third embodiment, the write word line 36 is arranged above the MTJ element 30. Another wiring line, contact, or the like is hardly located around the write word line 36. Compared to the conventional structure shown in FIG. 24, few restrictions are imposed on the position of the write word line 36, and the write word line 36 can be made thicker.

The third embodiment can also be applied to a structure without any contact fringe 28, like the first embodiment.

Further, a plurality of holes 29 may be formed in the bit line 27 in a direction in which the current flows. In this case, a recess 14 as shown in FIGS. 4 and 8 may be formed between adjacent holes 29 in the bit line 27. The recess 14 is preferably formed in a region except a region immediately below the MTJ element 30.

Fourth Embodiment

In the fourth embodiment, the structure of the semiconductor device according to the second embodiment is applied to a magnetic memory device. The MTJ element is arranged at the intersection of a contact fringe and write word line.

Figure 11:
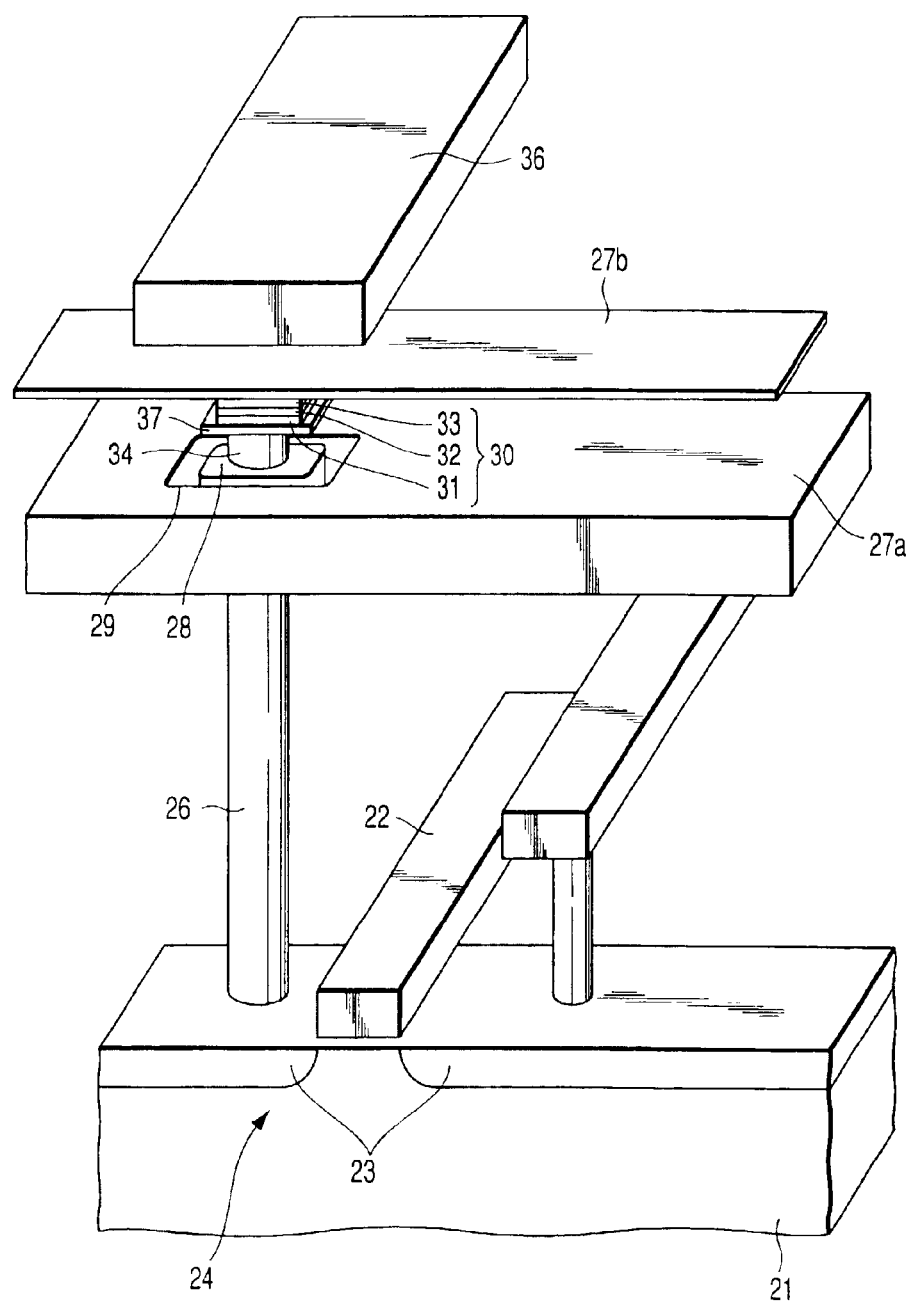
FIG. 11 is a perspective view showing a magnetic memory device according to the fourth embodiment of the present invention.
Figure 12:
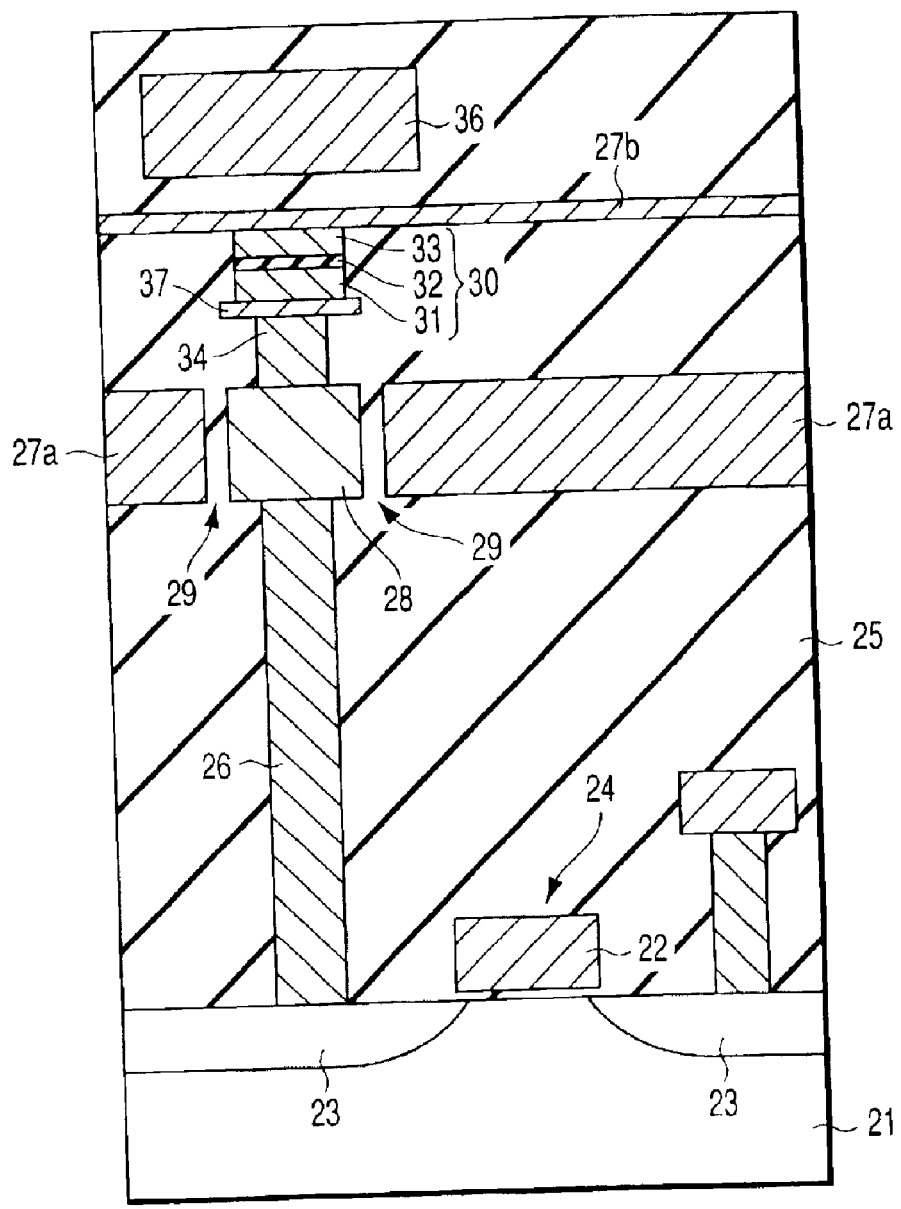
FIG. 12 is a sectional view showing the magnetic memory device according to the fourth embodiment of the present invention.

FIG. 11 is a perspective view showing the magnetic memory device according to the fourth embodiment of the present invention. FIG. 12 is a sectional view showing the magnetic memory device according to the fourth embodiment of the present invention. The structure of the magnetic memory device according to the fourth embodiment will be explained.

As shown in FIGS. 11 and 12, in the magnetic memory device according to the fourth embodiment, a hole 29 is formed in a write bit line 27a, and a contact fringe 28 is arranged in the hole 29. A write word line 36 which crosses the write bit line 27a is arranged above the contact fringe 28. An MTJ element 30 is interposed between the contact fringe 28 and the write word line 36. The contact fringe 28 is connected to contacts 26 and 34, and the contact 26 is connected to a source/drain diffusion layer 23 of a MOS transistor. The contact 34 is connected to the MTJ element 30 via a lower wiring line 37, and a read bit line 27b is arranged on the MTJ element 30. The MTJ element 30 arranged above the contact fringe 28 is connected to a MOS transistor 24 via the hole 29 of the write bit line 27a.

The magnetic memory device according to the fourth embodiment of the present invention is formed by the following method. A method of manufacturing the magnetic memory device according to the fourth embodiment will be explained briefly.

A gate electrode 22 is selectively formed on a semiconductor substrate 21, and source and drain diffusion layers 23 are formed in the semiconductor substrate 21 on the two sides of the gate electrode 22, forming a MOS transistor 24. The gate electrode 22 of the MOS transistor 24 serves as a read word line.

A contact 26 to be connected to the source/drain diffusion layer 23 is formed in an insulating film 25. A wiring material for the write bit line 27a and contact fringe 28 is formed and patterned. As a result, a write bit line 27a having a hole 29 is formed, and a contact fringe 28 is also formed in the hole 29. The write bit line 27a and contact fringe 28 have a gap between them, and are electrically isolated from each other.

A contact 34 is formed on the contact fringe 28, and a lower wiring line 37 is formed on the contact 34. An MTJ element 30 is formed on the lower wiring line 37, and a read bit line 27b is formed on the MTJ element 30. A write word line 36 is formed apart from the read bit line 27b above the MTJ element 30.

The magnetic memory device according to the fourth embodiment of the present invention writes and reads out data by the following operation. Write and read of the magnetic memory device according to the fourth embodiment will be described briefly.

To write data in the MTJ element 30, the write bit line 27a and write word line 36 are selected. A current is supplied to the write bit line 27a and write word line 36 to generate current magnetic fields. A combined magnetic field of the current magnetic fields generated by the write bit line 27a and write word line 36 is applied to the MTJ element 30. Data "1" or "0" is then written in the MTJ element 30.

To read out data written in the MTJ element 30, the MOS transistor 24 connected to the MTJ element 30 is turned on. A current is supplied to the read bit line 27b, MTJ element 30, lower wiring line 37, contact 34, contact fringe 28, contact 26, and source/drain diffusion layer 23. The resistance value of the MTJ element 30 is read, and data "1" or "0" is determined.

In the fourth embodiment, the MTJ element 30 is arranged above the hole 29 of the write bit line 27a. In writing data in the MTJ element 30, the current magnetic field from the write bit line 27a may decrease. However, the write bit line 27a has an enough width in the direction in which the write word line 36 runs. A sufficient current magnetic field can be generated from the write bit line 27a around the hole 29.

The fourth embodiment can obtain the same effects as those of the third embodiment.

In the fourth embodiment, the MTJ element 30 is arranged above the contact fringe 28. This arrangement leads to a smaller lateral area of the memory cell portion than that in the third embodiment.

The fourth embodiment can also be applied to a structure without any contact fringe 28, like the first embodiment.

Further, a plurality of holes 29 may be formed in the write bit line 27a in a direction in which the current flows. In this case, a recess 14 as shown in FIGS. 4 and 8 may be formed between adjacent holes 29 in the bit line 27.

Instead of forming a long read bit line 27b, like the write bit line 27a, a short read bit line 27b may be formed, like the upper wiring line 35 in FIG. 10, and connected to the write bit line 27a beside the MTJ element 30.

Fifth Embodiment

In the fifth embodiment, the structure of the semiconductor device according to the second embodiment is applied to a magnetic memory device. A plurality of MTJ elements are parallel-connected by upper and lower wiring lines into a so-called ladder-like structure.

Figure 13:
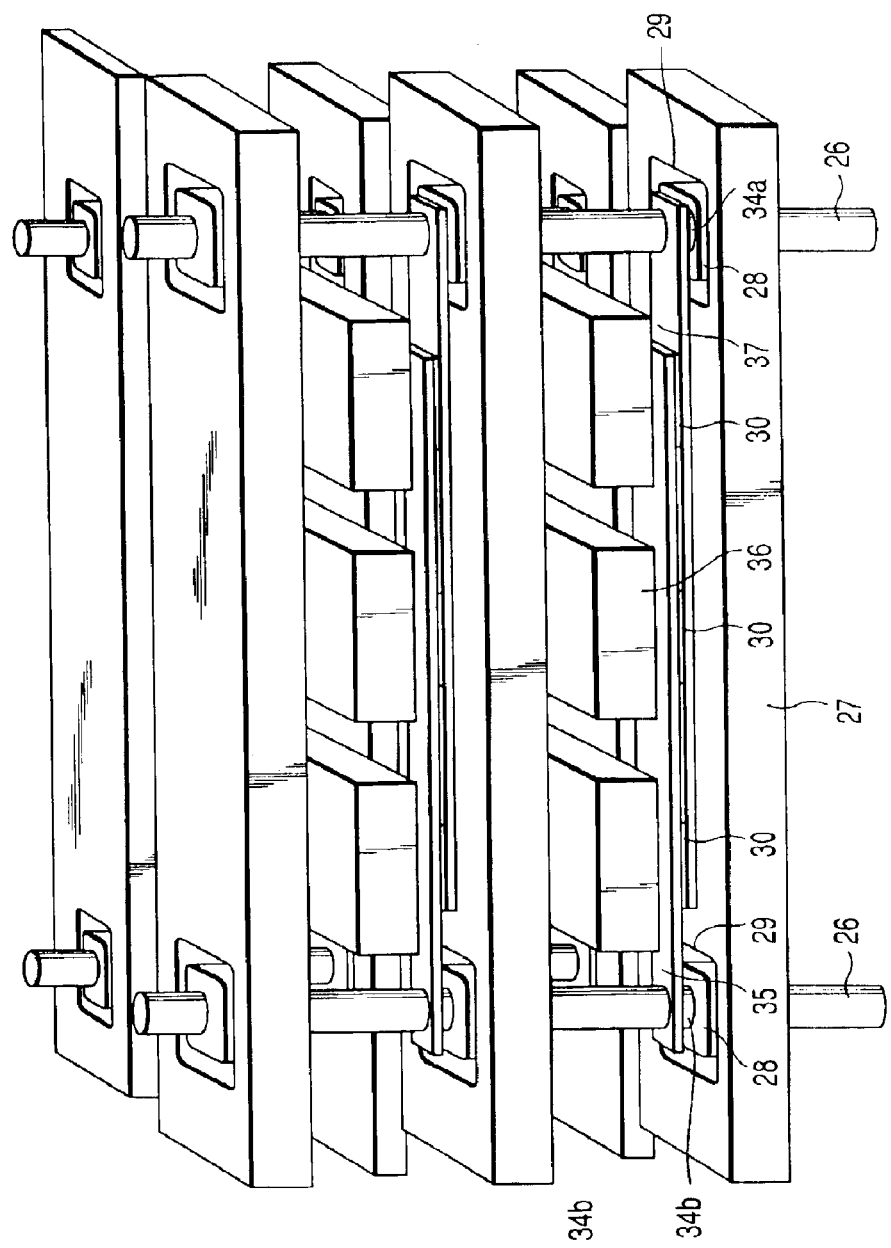
FIG. 13 is a perspective view showing a magnetic memory device according to the fifth embodiment of the present invention.
Figure 14:
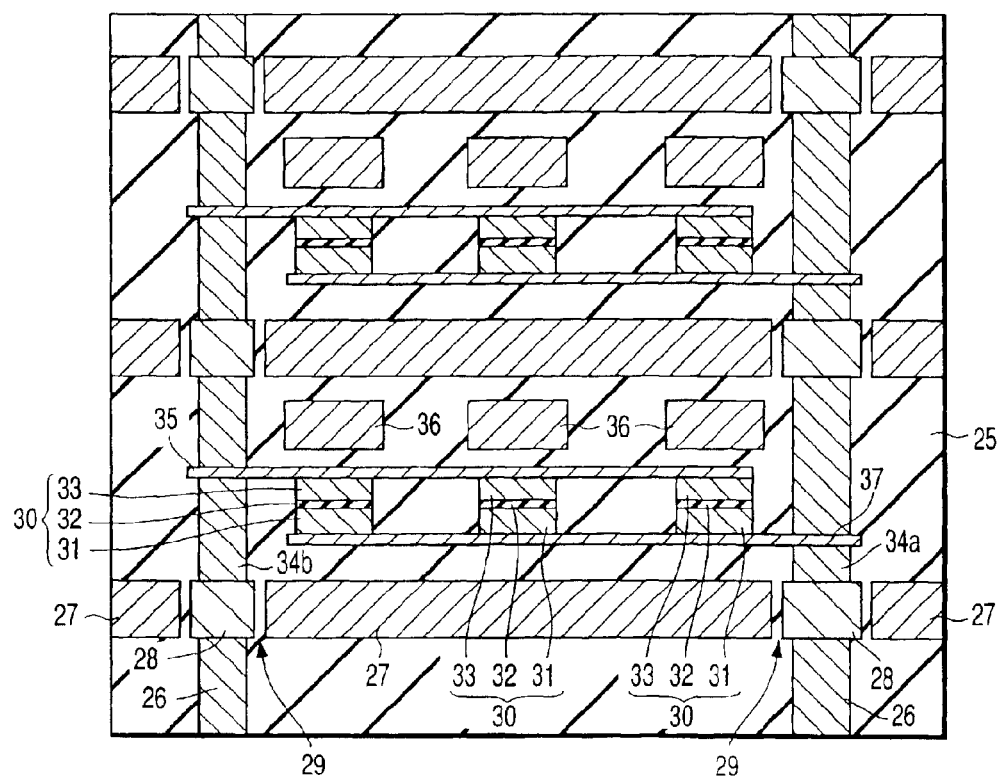
FIG. 14 is a sectional view showing the magnetic memory device according to the fifth embodiment of the present invention.

FIG. 13 is a perspective view showing the magnetic memory device according to the fifth embodiment of the present invention. FIG. 14 is a sectional view showing the magnetic memory device according to the fifth embodiment of the present invention. The structure of the magnetic memory device according to the fifth embodiment will be explained.

As shown in FIGS. 13 and 14, in the magnetic memory device according to the fifth embodiment, a plurality of MTJ elements 30 are parallel-arranged above each bit line 27. Magnetic recording layers 33 of the respective MTJ elements 30 are connected by an upper wiring line 35, and their magnetically fixed layers 31 are connected by a lower wiring line 37, forming a so-called ladder-like structure. Write word lines 36 are arranged apart from the upper wiring line 35 above the respective MTJ elements 30. Holes 29 are formed in the bit line 27, and contact fringes 28 are arranged in the holes 29. A contact 34a connected to the lower wiring line 37 and a contact 34b connected to the upper wiring line 35 are connected to the contact fringes 28. A plurality of MTJ elements 30 having the ladder-like structure are connected to contacts 26 via the holes 29 of the bit line 27. The contacts 26 are connected to, e.g., MOS transistors serving as data read switching elements.

The magnetic memory device according to the fifth embodiment of the present invention is formed by the following method. A method of manufacturing the magnetic memory device according to the fifth embodiment will be explained briefly.

MOS transistors (not shown) are formed on a semiconductor substrate (not shown), and contacts 26 to be connected to the source/drain diffusion layers (not shown) of the MOS transistors are formed.

A wiring material for the bit line 27 and contact fringe 28 is formed and patterned. As a result, a bit line 27 having holes 29 is formed, and contact fringes 28 are also formed in the holes 29. The bit line 27 and contact fringe 28 have a gap between them, and are electrically isolated from each other.

A contact 34a to be connected to the contact fringe 28 is formed. A lower wiring line 37 is formed apart from the bit line 27, and connected to the contact 34a. A plurality of MTJ elements 30 are formed on the lower wiring line 37. Each MTJ element 30 is made up of a magnetically fixed layer 31, a magnetic recording layer 33, and a tunnel junction layer 32 between the magnetically fixed layer 31 and the magnetic recording layer 33.

A contact 34b to be connected to the contact fringe 28 is formed. An upper wiring line 35 is formed above the MTJ elements 30, and connected to the contact 34b. Write word lines 36 are formed apart from the upper wiring line 35 above the respective MTJ elements 30.

The magnetic memory device according to the fifth embodiment of the present invention writes and reads out data by the following operation. Write and read of the magnetic memory device according to the fifth embodiment will be described briefly.

To write data in an arbitrary one of parallel-connected MTJ elements 30, the bit line 27 and write word line 36 are selected. A current is supplied to the bit line 27 and write word line 36 to generate current magnetic fields. A combined magnetic field of the current magnetic fields generated by the bit line 27 and write word line 36 is applied to the MTJ element 30. Data "1" or "0" is then written in the arbitrary MTJ element 30.

Read of data written in an arbitrary MTJ element 30 is executed as follows.

In the first cycle, a read MOS transistor connected to the parallel-connected MTJ elements 30 is turned on to supply the first read current to them. The first read current value at this time is stored in a sense circuit. After that, the read MOS transistor is turned off to disable the first read current.

In the second cycle, a current is supplied to the bit line 27 and write word line 36 again, and data "1" or "0" is written in an arbitrary MTJ element 30. The read MOS transistor is then turned off to disable the write current.

In the third cycle, the read MOS transistor connected to the parallel-connected MTJ elements 30 is turned on again to supply the second read current to them. The second read current value at this time is stored in the sense circuit.

Thereafter, the first and second read current values are compared to each other. Assume that an expected value "1" is written in write. In this case, if the first and second read current values do not change, "1" has been written; if the first and second read current values increase, "0" has been written. Assume that an expected value "0" is written in write. In this case, if the first and second read current values do not change, "0" has been written; if the first and second read current values increase, "1" has been written. In this manner, data which has been written in a cell can be read out.

In the fourth cycle, a current is supplied to the bit line 27 and word line 36 so as to write the same data as the initial state again, ending read.

The fifth embodiment can obtain the same effects as those of the third embodiment.

In the fifth embodiment, a read MOS transistor suffices to be formed for a plurality of parallel-connected MTJ elements 30. The fifth embodiment can reduce the memory cell area in comparison with a structure in which a read MOS transistor is arranged for one MTJ element 30.

The fifth embodiment can also be applied to a structure without any contact fringe 28, like the first embodiment.

A recess 14 as shown in FIGS. 4 and 8 may be formed between adjacent holes 29 of the bit line 27. In this case, the recess 14 is more preferably formed below a region between the MTJ elements 30 than below the parallel-connected MTJ elements 30.

Sixth Embodiment

In the sixth embodiment, the structure of the semiconductor device according to the second embodiment is applied to a magnetic memory device. A plurality of MTJ elements are stacked in a stacking direction and connected to each other.

Figure 15:
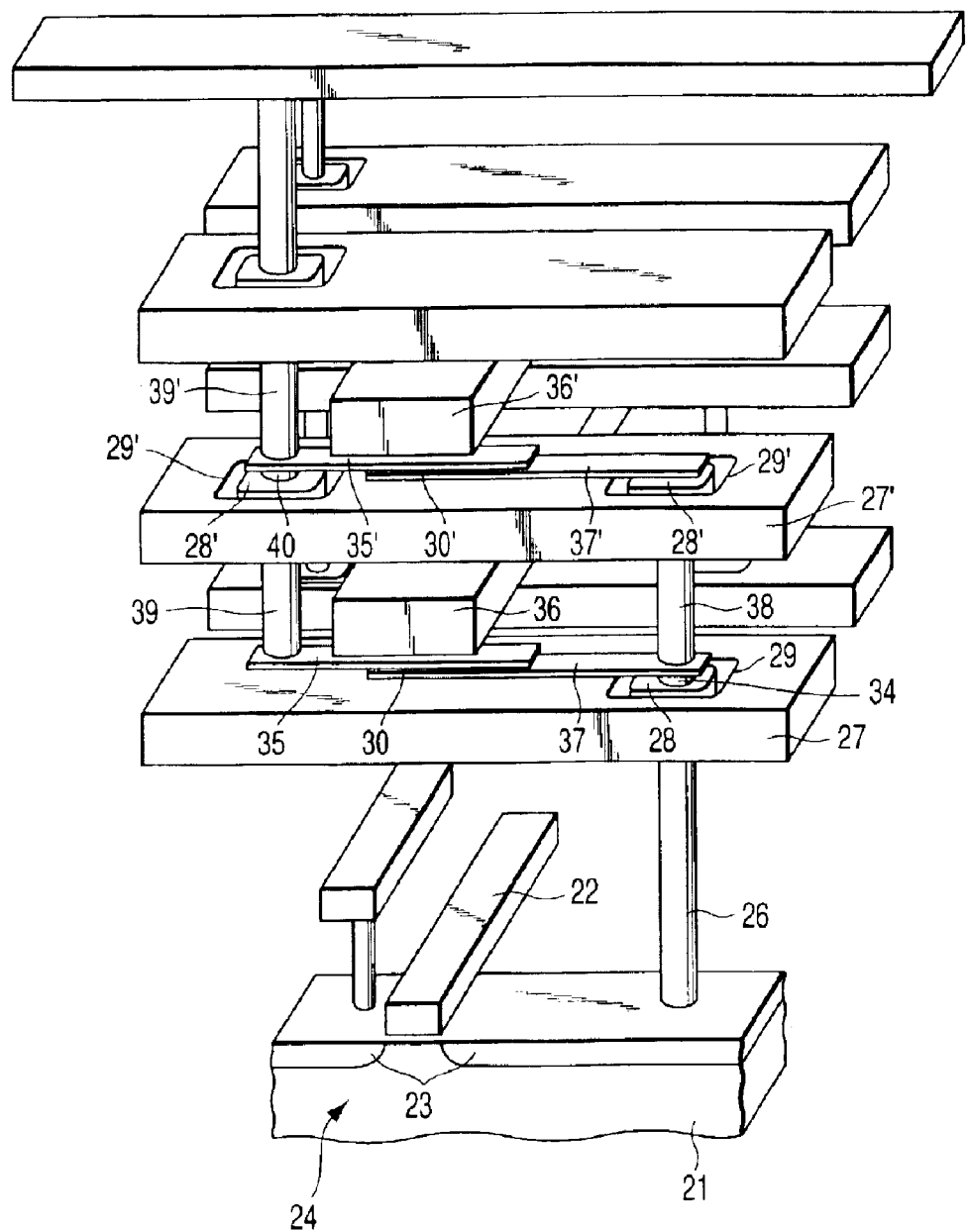
FIG. 15 is a perspective view showing a magnetic memory device according to the sixth embodiment of the present invention.
Figure 16:
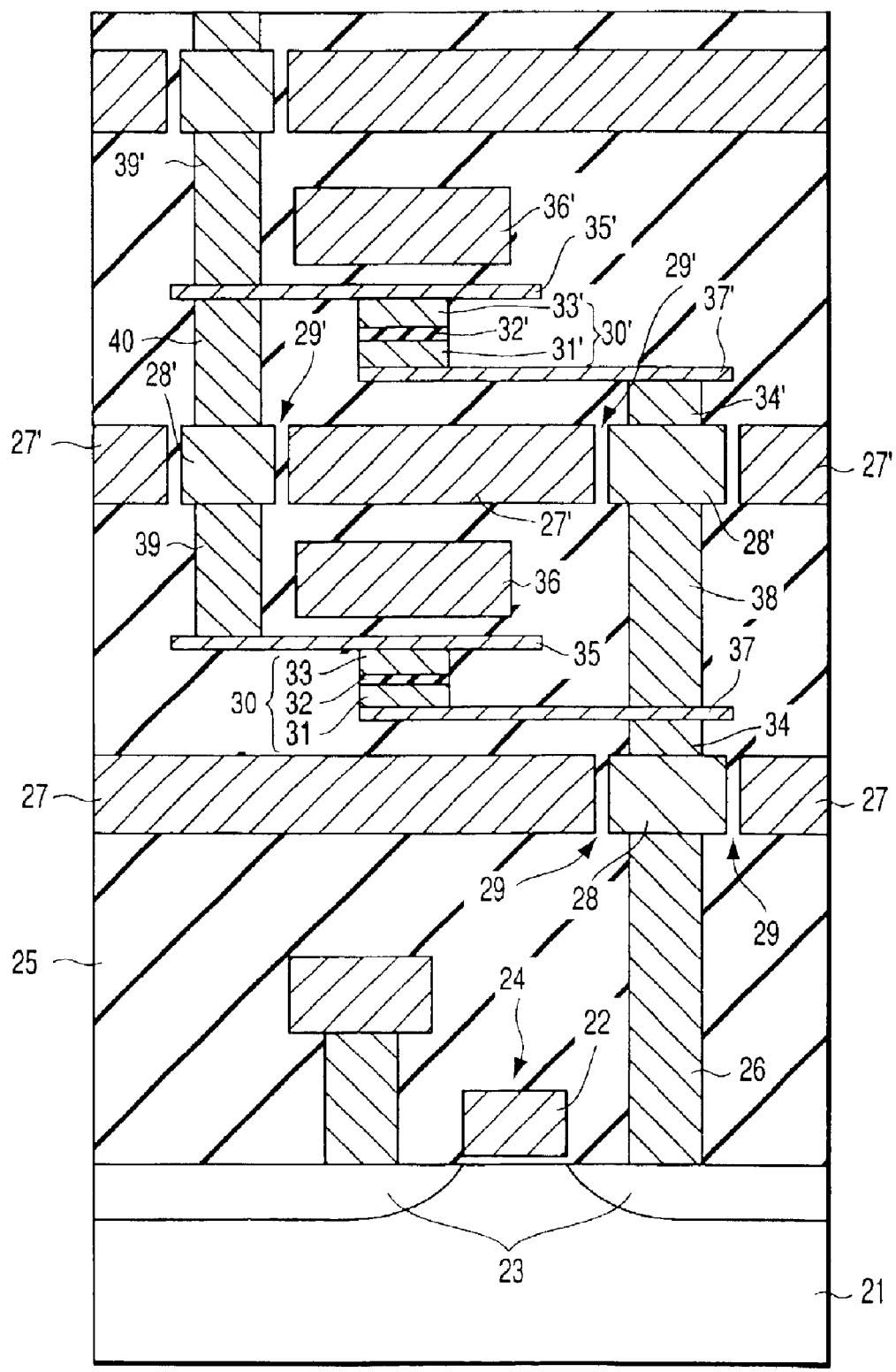
FIG. 16 is a sectional view showing the magnetic memory device according to the sixth embodiment of the present invention.

FIG. 15 is a perspective view showing the magnetic memory device according to the sixth embodiment of the present invention. FIG. 16 is a sectional view showing the magnetic memory device according to the sixth embodiment of the present invention. The structure of the magnetic memory device according to the sixth embodiment will be explained.

As shown in FIGS. 15 and 16, in the magnetic memory device according to the sixth embodiment, a first bit line 27 and first write word line 36 cross each other. A hole 29 is formed in the first bit line 27, and a contact fringe 28 is arranged in the hole 29. A first MTJ element 30 is arranged apart from the first bit line 27 and first write word line 36 at the intersection of the first bit line 27 and first write word line 36. A magnetically fixed layer 31 of the first MTJ element 30 is connected to a first lower wiring line 37, and a magnetic recording layer 33 of the first MTJ element 30 is connected to a first upper wiring line 35.

A second bit line 27' and second write word line 36' cross each other above the first write word line 36. Holes 29' are formed in the second bit line 27', and contact fringes 28' are arranged in the holes 29'. A second MTJ element 30' is arranged apart from the second bit line 27' and second write word line 36' at the intersection of the second bit line 27' and second write word line 36'. A magnetically fixed layer 31' of the second MTJ element 30' is connected to a second lower wiring line 37', and a magnetic recording layer 33' of the second MTJ element 30' is connected to a second upper wiring line 35'.

The second upper wiring line 35' is connected to the first MTJ element 30 via a contact 40, the contact fringe 28', a contact 39, and the first upper wiring line 35. The second lower wiring line 37' is connected to the first MTJ element 30 via a contact 34', the contact fringe 28', a contact 38, and the first lower wiring line 37. The first MTJ element 30 is connected to a source/drain diffusion layer 23 of a MOS transistor 24 via the first lower wiring line 37, a contact 34, the contact fringe 28, and a contact 26. In this fashion, the first and second MTJ elements 30 and 30' are connected via the holes 29' of the second bit line 27'. The first and second MTJ elements 30 and 30' are connected to the MOS transistor 24 via the hole 29 of the first bit line 27.

The magnetic memory device according to the sixth embodiment of the present invention is formed by the following method. A method of manufacturing the magnetic memory device according to the sixth embodiment will be explained briefly.

A gate electrode 22 is selectively formed on a semiconductor substrate 21, and source and drain diffusion layers 23 are formed in the semiconductor substrate 21 on the two sides of the gate electrode 22, forming a MOS transistor 24. The gate electrode 22 of the MOS transistor 24 serves as a read word line.

A contact 26 to be connected to the source/drain diffusion layer 23 is formed in an insulating film 25. A wiring material for the first bit line 27 and contact fringe 28 is formed and patterned. As a result, a first bit line 27 having a hole 29 is formed, and a contact fringe 28 is also formed in the hole 29. The first bit line 27 and contact fringe 28 have a gap between them, and are electrically isolated from each other.

A contact 34 is formed on the contact fringe 28, and a lower wiring line 37 is formed on the contact 34. A first MTJ element 30 is formed on the lower wiring line 37. The first MTJ element 30 is made up of a magnetically fixed layer 31, a magnetic recording layer 33, and a tunnel junction layer 32 between the magnetically fixed layer 31 and the magnetic recording layer 33.

An upper wiring line 35 is formed on the first MTJ element 30, and a first write word line 36 is formed apart from the upper wiring line 35 above the first MTJ element 30.

A contact 38 to be connected to the lower wiring line 37 and a contact 39 to be connected to the upper wiring line 35 are formed.

A wiring material for the second bit line 27' and contact fringe 28' is formed and patterned. Accordingly, a second bit line 27' having holes 29' is formed, and contact fringes 28' are also formed in the holes 29'. The second bit line 27' and contact fringe 28' have a gap between them, and are electrically isolated from each other.

A contact 34' is formed on the contact fringe 28', and a lower wiring line 37' is formed on the contact 34'. A second MTJ element 30' is formed on the lower wiring line 37'. The second MTJ element 30' is made up of a magnetically fixed layer 31', a magnetic recording layer 33', and a tunnel junction layer 32' between the magnetically fixed layer 31' and the magnetic recording layer 33'.

A contact 40 to be connected to the contact fringe 28' is then formed. An upper wiring line 35' is formed on the contact 40 and second MTJ element 30', and a second write word line 36' is formed apart from the upper wiring line 35' above the second MTJ element 30'.

The magnetic memory device according to the sixth embodiment of the present invention writes and reads out data by the same operation as that of the fifth embodiment.

The sixth embodiment can obtain the same effects as those of the third embodiment.

In the sixth embodiment, the read MOS transistor 24 suffices to be formed for a plurality of connected MTJ elements 30 and 30'. Similar to the fifth embodiment, the sixth embodiment can reduce the memory cell area in comparison with a structure in which a read MOS transistor is arranged for one MTJ element 30.

Figure 17:
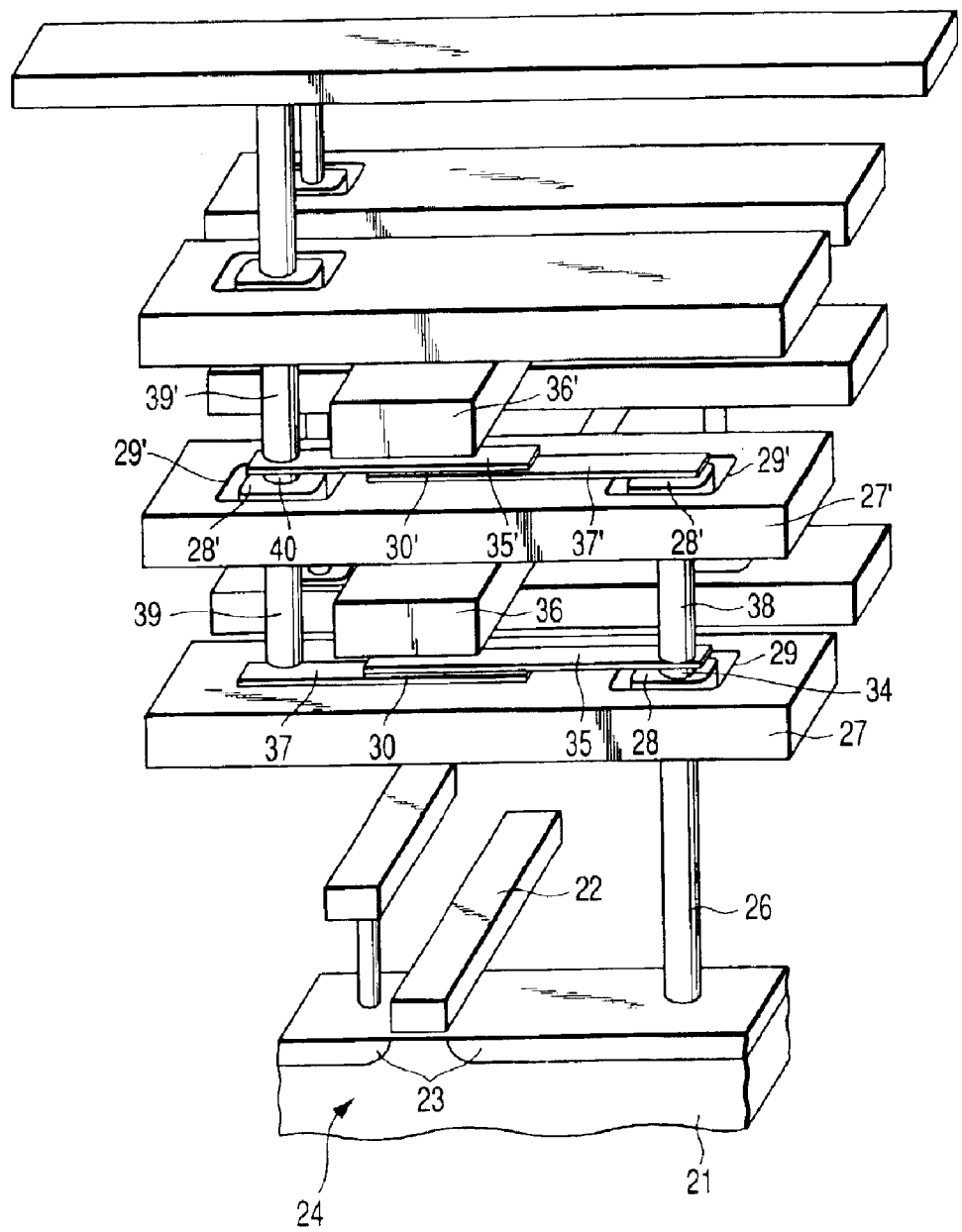
FIG. 17 is a perspective view showing another magnetic memory device according to the sixth embodiment of the present invention.
Figure 18:
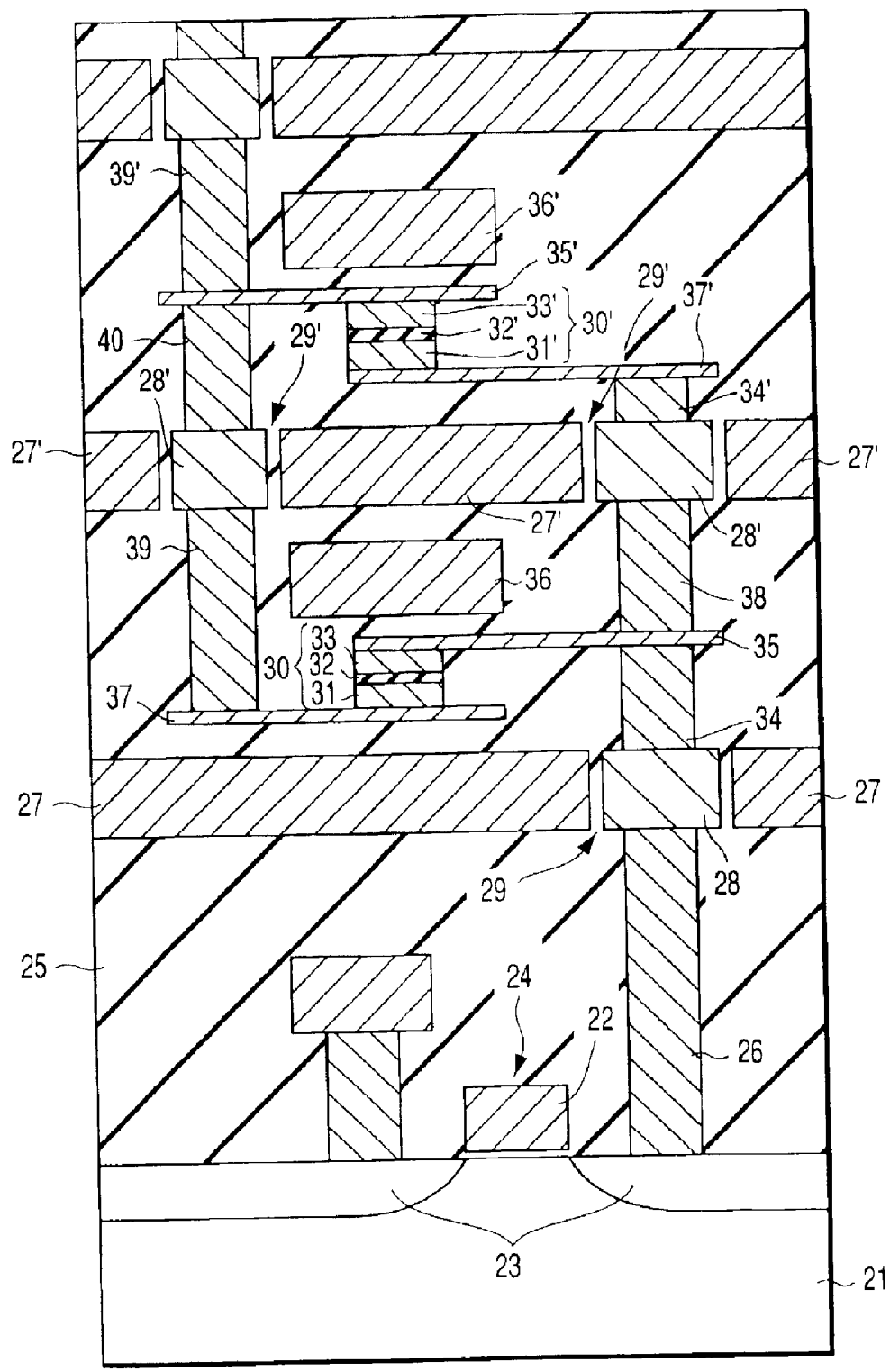
FIG. 18 is a sectional view showing the magnetic memory device according to the sixth embodiment of the present invention.

In the sixth embodiment, the connection of the first and second MTJ elements 30 and 30' is not limited to the above-mentioned one. For example, as shown in FIGS. 17 and 18, the upper and lower wiring lines 35' and 37' of the second MTJ element 30' are given the same structure as the above-mentioned one. The pattern of the upper and lower wiring lines 35 and 37 of the first MTJ element 30 is reversed from that of the upper and lower wiring lines 35' and 37' of the second MTJ element 30'.

The sixth embodiment can also be applied to a structure without any contact fringe 28, like the first embodiment.

A recess 14 as shown in FIGS. 4 and 8 may be formed between adjacent holes 29 of the first bit line 27 or between adjacent holes 29' of the second bit line 27'. In this case, the recess 14 is preferably formed in a region except regions below the MTJ elements 30 and 30'.

Seventh Embodiment

In the seventh embodiment, the structure of the semiconductor device according to the second embodiment is applied to a magnetic memory device. A plurality of MTJ elements are stacked in a stacking direction and series-connected to each other.

Figure 19:
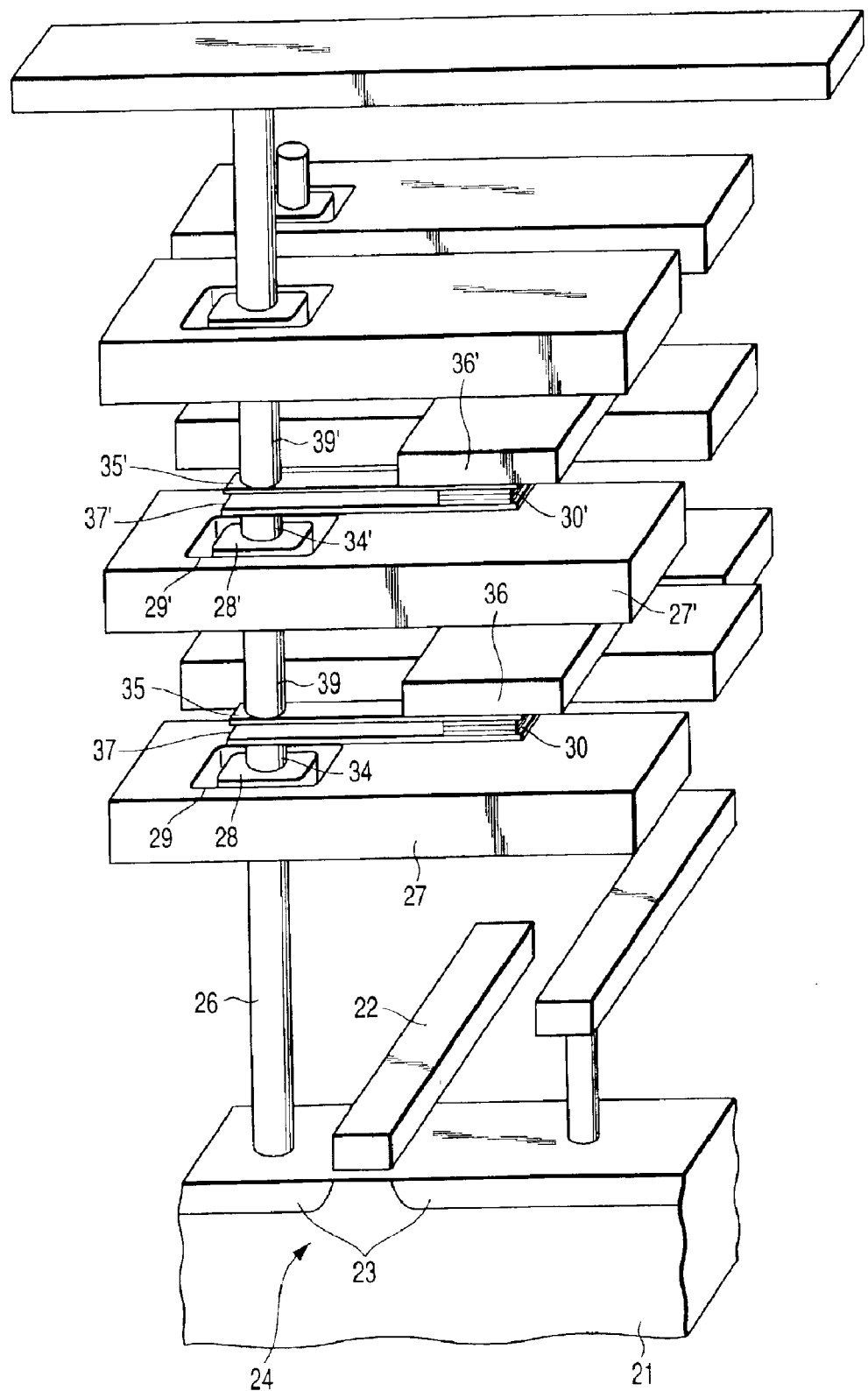
FIG. 19 is a perspective view showing a magnetic memory device according to the seventh embodiment of the present invention.
Figure 20:
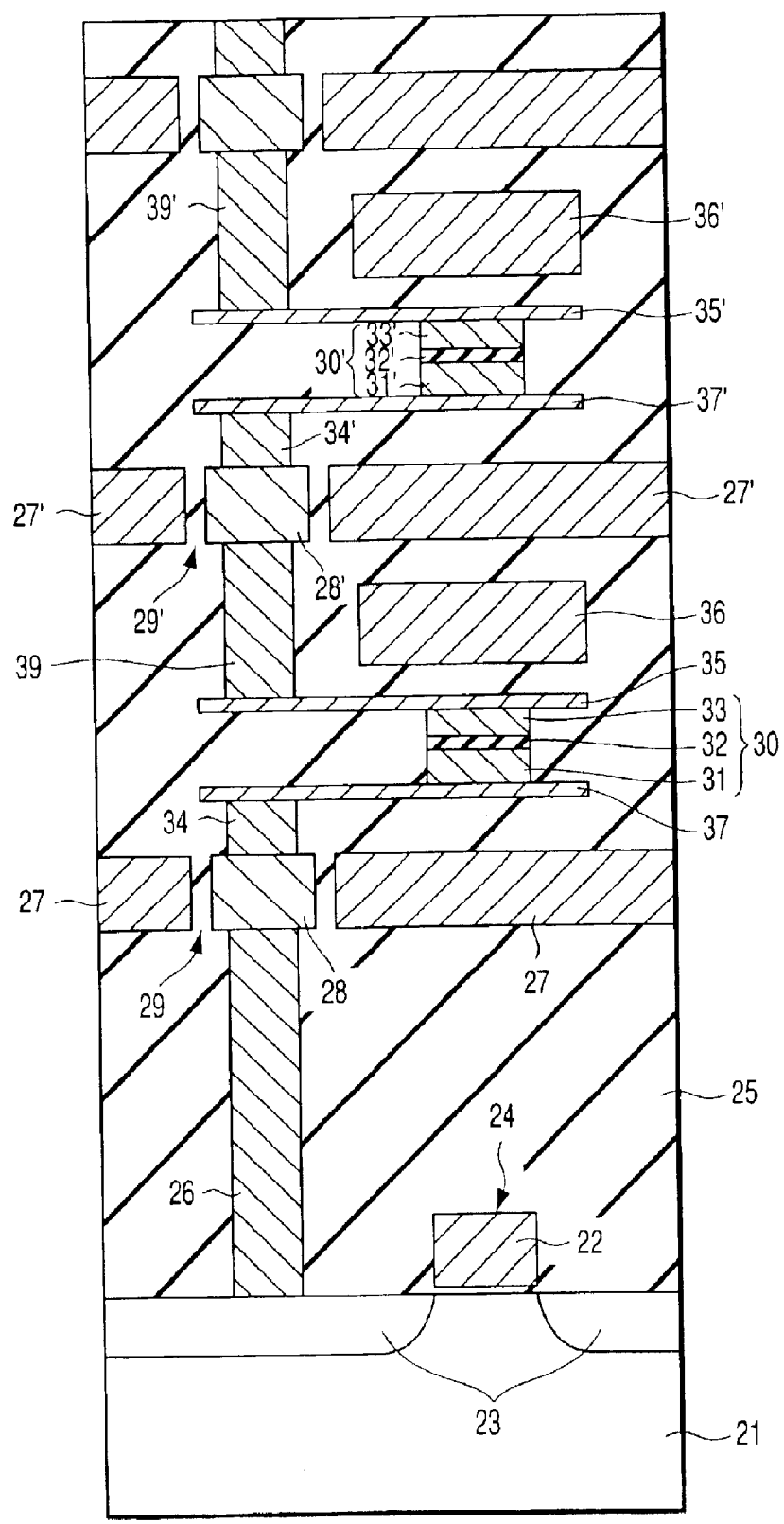
FIG. 20 is a sectional view showing the magnetic memory device according to the seventh embodiment of the present invention.

FIG. 19 is a perspective view showing the magnetic memory device according to the seventh embodiment of the present invention. FIG. 20 is a sectional view showing the magnetic memory device according to the seventh embodiment of the present invention. The structure of the magnetic memory device according to the seventh embodiment will be explained.

As shown in FIGS. 19 and 20, in the magnetic memory device according to the seventh embodiment, a first bit line 27 and first write word line 36 cross each other. A hole 29 is formed in the first bit line 27, and a contact fringe 28 is arranged in the hole 29. A first MTJ element 30 is arranged apart from the first bit line 27 and first write word line 36 at the intersection of the first bit line 27 and first write word line 36. A magnetically fixed layer 31 of the first MTJ element 30 is connected to a first lower wiring line 37, and a magnetic recording layer 33 of the first MTJ element 30 is connected to a first upper wiring line 35.

A second bit line 27' and second write word line 36' cross each other above the first write word line 36. A hole 29' is formed in the second bit line 27', and a contact fringe 28' is arranged in the hole 29'. A second MTJ element 30' is arranged apart from the second bit line 27' and second write word line 36' at the intersection of the second bit line 27' and second write word line 36'. A magnetically fixed layer 31' of the second MTJ element 30' is connected to a second lower wiring line 37', and a magnetic recording layer 33' of the second MTJ element 30 is connected to a second upper wiring line 35'.

The second lower wiring line 37' is connected to the first MTJ element 30 via a contact 34', the contact fringe 28', a contact 39, and the first upper wiring line 35. The first MTJ element 30 is connected to a source/drain diffusion layer 23 of a MOS transistor 24 via the first lower wiring line 37, a contact 34, the contact fringe 28, and a contact 26. In this way, the first and second MTJ elements 30 and 30' are series-connected via the hole 29' of the second bit line 27'. The first and second MTJ elements 30 and 30' are connected to the MOS transistor 24 via the hole 29 of the first bit line 27.

The magnetic memory device according to the seventh embodiment of the present invention is formed by the following method. A method of manufacturing the magnetic memory device according to the seventh embodiment will be explained briefly.

A gate electrode 22 is selectively formed on a semiconductor substrate 21, and source and drain diffusion layers 23 are formed in the semiconductor substrate 21 on the two sides of the gate electrode 22, forming a MOS transistor 24. The gate electrode 22 of the MOS transistor 24 serves as a read word line.

A contact 26 to be connected to the source/drain diffusion layer 23 is formed in an insulating film 25. A wiring material for the first bit line 27 and contact fringe 28 is formed and patterned. As a result, a first bit line 27 having a hole 29 is formed, and a contact fringe 28 is also formed in the hole 29. The first bit line 27 and contact fringe 28 have a gap between them, and are electrically isolated from each other.

A contact 34 is formed on the contact fringe 28, and a lower wiring line 37 is formed on the contact 34. A first MTJ element 30 is formed on the lower wiring line 37. The first MTJ element 30 is made up of a magnetically fixed layer 31, a magnetic recording layer 33, and a tunnel junction layer 32 between the magnetically fixed layer 31 and the magnetic recording layer 33.

An upper wiring line 35 is formed on the first MTJ element 30, and a first write word line 36 is formed apart from the upper wiring line 35 above the first MTJ element 30. A contact 39 to be connected to the upper wiring line 35 is formed.

A wiring material for the second bit line 27' and contact fringe 28' is formed and patterned. Accordingly, a second bit line 27' having a hole 29' is formed, and a contact fringe 28' is also formed in the hole 29'. The second bit line 27' and contact fringe 28' have a gap between them, and are electrically isolated from each other.

A contact 34' is formed on the contact fringe 28', and a lower wiring line 37' is formed on the contact 34'. A second MTJ element 30' is formed on the lower wiring line 37'. The second MTJ element 30' is made up of a magnetically fixed layer 31', a magnetic recording layer 33', and a tunnel junction layer 32' between the magnetically fixed layer 31' and the magnetic recording layer 33'.

An upper wiring line 35' is formed on the second MTJ element 30', and a second write word line 36' is formed apart from the upper wiring line 35' above the second MTJ element 30'.

The magnetic memory device according to the seventh embodiment of the present invention writes and reads out data by the same operation as that of the fifth embodiment.

The seventh embodiment can obtain the same effects as those of the third embodiment.

In the seventh embodiment, the read MOS transistor 24 suffices to be formed for the series-connected MTJ elements 30 and 30'. Similar to the fifth and sixth embodiments, the seventh embodiment can reduce the memory cell area in comparison with a structure in which a read MOS transistor is arranged for one MTJ element 30.

The seventh embodiment can also be applied to a structure without any contact fringe 28, like the first embodiment.

A recess 14 as shown in FIGS. 4 and 8 may be formed between adjacent holes 29 of the bit line 27 or between adjacent holes 29' of the bit line 27'. In this case, the recess 14 is preferably formed in a region except regions below the MTJ elements 30 and 30'.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

Figure 21:
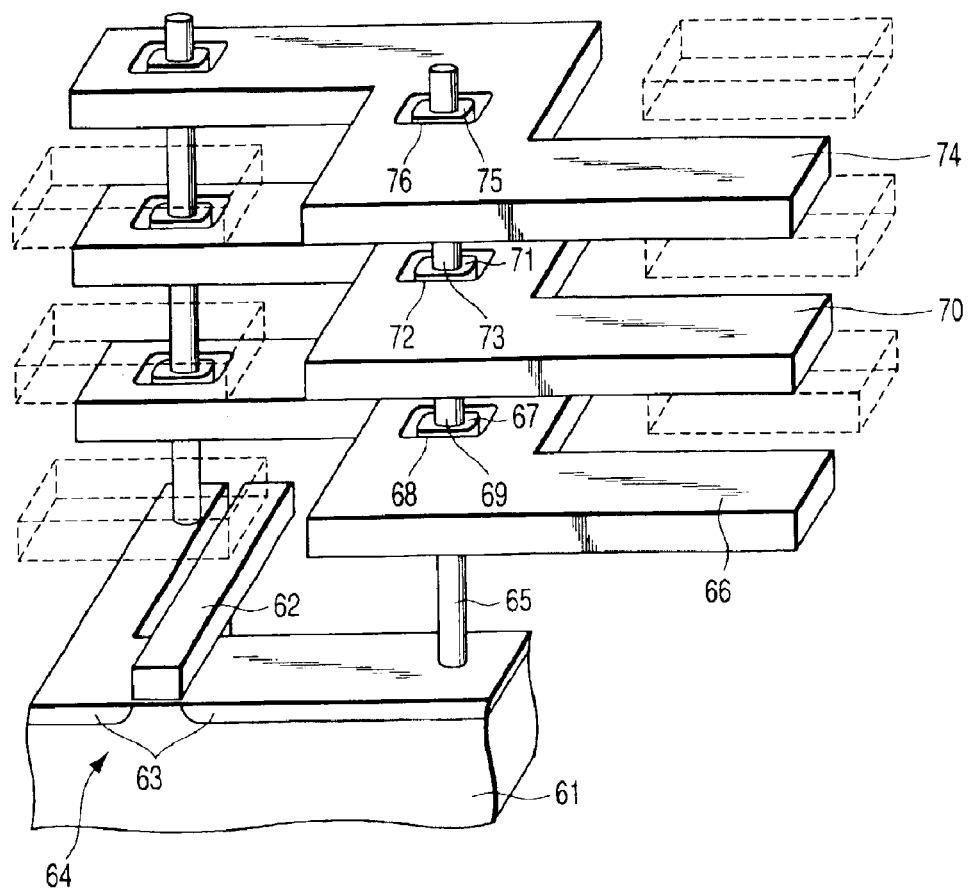
FIG. 21 is a perspective view showing a semiconductor device with a multilayered wiring structure according to still another embodiment of the present invention.
Figure 22:
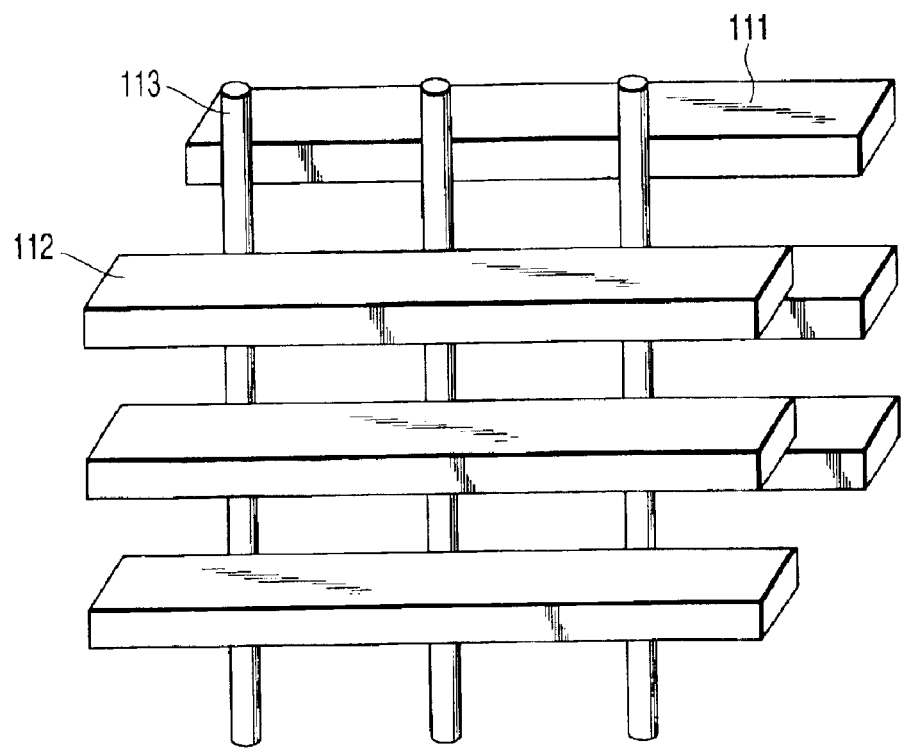
FIG. 22 is a perspective view showing a conventional semiconductor device having a thick wiring line of a multilayered structure.
Figure 23:
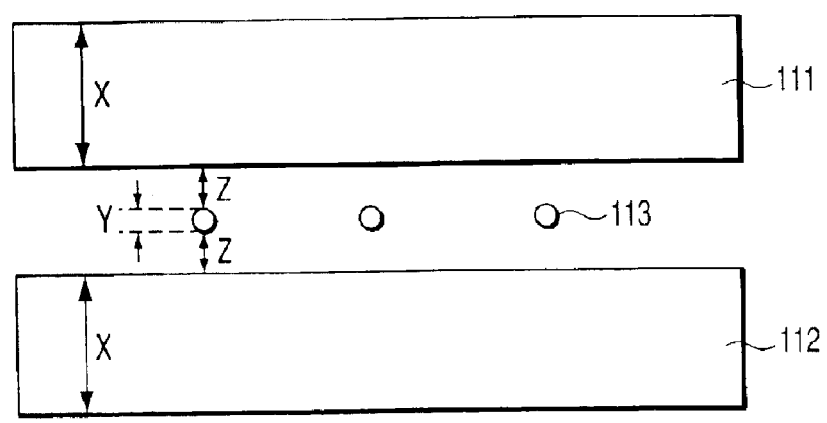
FIG. 23 is a plan view showing the conventional semiconductor device with a thick wiring line.

For example, the wiring structure according to the second embodiment can be applied to a semiconductor device having multilayered wiring such as a DRAM, as shown in FIG. 21. Also in this case, holes 68, 72, and 76 are formed in wiring lines 66, 70, and 74. Contacts 65, 69, and 73 having contact fringes 67, 71, and 75 extend through the holes 68, 72, and 76. The wiring lines 66, 70, and 74 are, e.g., directional current wiring lines through which a large current flows.

For example, the third to seventh embodiments employ an MTJ element as a memory element in a magnetic memory device. The MTJ element may be replaced by a GMR (Giant Magneto-Resistance) element formed from two magnetic layers and a conductive layer sandwiched between them.

For example, the third to seventh embodiments employ as a memory element an MTJ element with a single-junction structure formed from one tunnel junction layer. Instead, an MTJ element with a double-junction structure formed from two tunnel junction layers may be used.

For example, the third to seventh embodiments employ the MOS transistor 24 as a data read switching element. However, the data read switching element is not limited to this, and may be, e.g., a diode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first wiring line having a first through hole;
   a first connection member which extends through the first through hole at an interval from the first wiring line, the first connection member not being electrically connected to the first wiring line; and
   a recess which is formed in the first wiring line and decreases a width of the first wiring line.

2. A semiconductor device comprising:
   a first wiring line having a first through hole;
   a first connection member which extends through the first through hole at an interval from the first wiring line, the first connection member not being electrically connected to the first wiring line; and a contact fringe which is arranged apart from the first wiring line in the first through hole.

3. The device according to claim 2, wherein a thickness of the contact fringe is equal to a thickness of the first wiring line.

4. A semiconductor device comprising:
a first wiring line having a first through hole;
a first connection member which extends through the first through hole at an interval from the first wiring line, the first connection member not being electrically connected to the first wiring line; and
a magneto-resistance element which is connected to the first connection member.

5. The device according to claim 4, wherein the first wiring line includes a bit line.

6. The device according to claim 4, wherein the magneto-resistance element includes an MTJ element which is formed from at least a first magnetic layer, a second magnetic layer, and a nonmagnetic layer.

7. The device according to claim 6, wherein the MTJ element has a single-junction structure or a double-junction structure.

8. The device according to claim 4, further comprising a contact fringe which is arranged apart from the first wiring line in the first through hole.

9. The device according to claim 8, wherein a thickness of the contact fringe is equal to a thickness of the first wiring line.

10. The device according to claim 4, further comprising a recess which is formed in the first wiring line and decreases a width of the first wiring line.

11. The device according to claim 4, further comprising a transistor or a diode which is connected to the first connection member.

12. A semiconductor device comprising:
a first wiring line having a first through hole;
a first connection member which extends through the first through hole at an interval from the first wiring line, the first connection member not being electrically connected to the first wiring line;
a second wiring line which is arranged apart from the first wiring line, the first wiring line running in a first direction, the second wiring line running in a second direction different from the first direction;
a third wiring line which is arranged apart from the first and second wiring lines between the first and second wiring lines and connected to the first connection member; and
a magneto-resistance element which is arranged at an intersection of the first and second wiring lines between the first and third wiring lines and connected to the first and third wiring lines.

13. The device according to claim 12, wherein the first wiring line includes a bit line and the second wiring line includes a write word line.

14. The device according to claim 12, further comprising a contact fringe which is arranged apart from the first wiring line in the first through hole.

15. A semiconductor device comprising:
a first wiring line having a first through hole;
a first connection member which extends through the first through hole at an interval from the first wiring line, the first connection member not being electrically connected to the first wiring line;
a second wiring line which is arranged apart from the first wiring line running in a first direction and runs in a second direction different from the first direction;
a third wiring line which is arranged apart from the first and second wiring lines between the first and second wiring lines; and
a magneto-resistance element which is arranged at an intersection of the first and second wiring lines between the first and third wiring lines and connected to the third wiring line and the first connection member.

16. The device according to claim 15, wherein the first wiring line includes a write bit line, the second wiring line includes a write word line and the third wiring line includes a read bit line.

17. The device according to claim 15, further comprising a contact fringe which is arranged apart from the first wiring line in the first through hole.

18. A semiconductor device comprising:
a first wiring line having a first through hole;
a first connection member which extends through the first through hole at an interval from the first wiring line, the first connection member not being electrically connected to the first wiring line;
a plurality of second wiring lines which are arranged apart from the first wiring line, the first wiring line running in a first direction, the second wiring line running in a second direction different from the first direction, the first wiring line having the first through hole and a second through hole;
a plurality of magneto-resistance elements which are arranged at intersections of the first and second wiring lines between the first and second wiring lines and have one-end portions facing the first wiring line and other-end portions facing the second wiring line;
a third wiring line which is connected to the one-end portions of the magneto-resistance elements, arranged apart from the first wiring line, and connected to the first connection member;
a fourth wiring line which is connected to the other-end portions of the magneto-resistance elements and arranged apart from the second wiring line; and
a second connection member which is connected to the fourth wiring line and extends through the second through hole at an interval from the first wiring line.

19. The device according to claim 18, wherein the first wiring line includes a bit line and the second wiring line includes a write word line.

20. The device according to claim 18, further comprising:
a first contact fringe which is arranged apart from the first wiring line in the first through hole; and
a second contact fringe which is arranged apart from the first wiring line in the second through hole.

21. A semiconductor device comprising:
a first wiring line having a first through hole;
a first connection member which extends through the first through hole at an interval from the first wiring line, the first connection member not being electrically connected to the first wiring line;
a second wiring line which is arranged apart from the first wiring line, the first wiring line running in a first direction, the second wiring line running in a second direction different from the first direction;
a first magneto-resistance element which is arranged at an intersection of the first and second wiring lines between the first and second wiring lines and has one end portion and the other end portion;
a third wiring line which is connected to the one end portion of the first magneto-resistance element and the first connection member and arranged apart from the first wiring line;
a fourth wiring line which is connected to the other end portion of the first magneto-resistance element and arranged apart from the second wiring line;
a fifth wiring line which is arranged apart from the second wiring line, runs in the first direction, and has second and third through holes;

a sixth wiring line which is arranged apart from the fifth wiring line and runs in the second direction;

a second magneto-resistance element which is arranged at an intersection of the fifth and sixth wiring lines between the fifth and sixth wiring lines and has one end portion and the other end portion;

a seventh wiring line which is connected to the one end portion of the second magneto-resistance element and arranged apart from the fifth wiring line;

an eighth wiring line which is connected to the other end portion of the second magneto-resistance element and arranged apart from the sixth wiring line;

a second connection member which is connected to the third and seventh wiring lines and extends through the second through hole at an interval from the fifth wiring line; and a third connection member which is connected to the fourth and eighth wiring lines and extends through the third through hole at an interval from the fifth wiring line.

22. The device according to claim 21, wherein the first wiring line includes a first bit line, the second wiring line includes a first write word line, the fifth wiring line includes a second bit line and the sixth wiring line includes a second write word line.

23. The device according to claim 21, further comprising:
a first contact fringe which is arranged apart from the first wiring line in the first through hole;
a second contact fringe which is arranged apart from the fifth wiring line in the second through hole; and
a third contact fringe which is arranged apart from the fifth wiring line in the third through hole.

24. A semiconductor device comprising:
a first wiring line having a first through hole;
a first connection member which extends through the first through hole at an interval from the first wiring line, the first connection member not being electrically connected to the first wiring line;
a second wiring line which is arranged apart from the first wiring line, the first wiring line running in a first direction, the second wiring line running in a second direction different from the first direction;
a first magneto-resistance element which is arranged at an intersection of the first and second wiring lines between the first and second wiring lines and has one end portion and the other end portion;
a third wiring line which is connected to the one end portion of the first magneto-resistance element and the first connection member and arranged apart from the first wiring line;
a fourth wiring line which is connected to the other end portion of the first magneto-resistance element and arranged apart from the second wiring line;
a fifth wiring line which is arranged apart from the second wiring line, runs in the first direction, and has a second through hole;
a sixth wiring line which is arranged apart from the fifth wiring line and runs in the second direction;
a second magneto-resistance element which is arranged at an intersection of the fifth and sixth wiring lines between the fifth and sixth wiring lines and has one end portion and the other end portion;
a seventh wiring line which is connected to the one end portion of the second magneto-resistance element and arranged apart from the fifth wiring line;
an eighth wiring line which is connected to the other end portion of the second magneto-resistance element and arranged apart from the sixth wiring line; and
a second connection member which is connected to the fourth and seventh wiring lines and extends through the second through hole at an interval from the fifth wiring line.

25. The device according to claim 24, wherein the first wiring line includes a first bit line, the second wiring line includes a first write word line, the fifth wiring line includes a second bit line and the sixth wiring line includes a second write word line.

26. The device according to claim 24, further comprising:
a first contact fringe which is arranged apart from the first wiring line in the first through hole; and
a second contact fringe which is arranged apart from the fifth wiring line in the second through hole.

27. A semiconductor device comprising:
a first wiring line having a first through hole;
a first connection member which extends through the first through hole at an interval from the first wiring line;
a contact fringe which is arranged apart from the first wiring line in the first through hole.

28. The device according to claim 27, wherein a thickness of the contact fringe is equal to a thickness of the first wiring line.

29. A semiconductor device comprising:
a first wiring line having a first through hole;
a first connection member which extends through the first through hole at an interval from the first wiring line;
a magneto-resistance element which is connected to the first connection member; and
a contact fringe which is arranged apart from the first wiring line in the first through hole.

30. The device according to claim 29, wherein a thickness of the contact fringe is equal to a thickness of the first wiring line.

31. A semiconductor device comprising:
a first wiring line having a first through hole;
a first connection member which extends through the first through hole at an interval from the first wiring line;
a magneto-resistance element which is connected to the first connection member; and
a recess which is formed in the first wiring line and decreases a width of the first wiring line.

32. A semiconductor device comprising:
a first wiring line having a first through hole;
a first connection member which extends through the first through hole at an interval from the first wiring line;
a second wiring line, which is arranged apart from the first wiring line, the first wiring line running in a first direction, and the second wiring line running in a second direction different from the first direction;
a third wiring line which is arranged apart from the first and second wiring lines between the first and second wiring lines and connected to the first connection member;
a magneto-resistance element which is arranged at an intersection of the first and second wiring lines between the first and third wiring lines and connected to the first and third wiring lines; and
a contact fringe which is arranged apart from the first wiring line in the first through hole.

33. A semiconductor device comprising:
a first wiring line having a first through hole;
a first connection member which extends through the first through hole at an interval from the first wiring line;
a second wiring line, which is arranged apart from the first wiring line running in a first direction, and which round in a second direction different from the first direction;

a third wiring line which is arranged apart from the first and second wiring lines between the first and second wiring lines;

a magneto-resistance element which is arranged at an intersection of the first and second wiring lines between the first and third wiring lines and connected to the wiring line and the first connection member; and a contact fringe which is arranged apart from the first wiring line in the first through hole.

34. A semiconductor device comprising:

a first wiring line having a first through hole;

a first connection member which extends through the first through hole at an interval from the first wiring line;

a plurality of second wiring lines which are arranged apart from the first wiring line, the first wiring line running in a first direction, the second wiring line running in a second direction different from the first direction, and the first wiring line having the first through hole and a second through hole;

a plurality of magneto-resistance elements which are arranged at intersections of the first and second wiring lines between the first and second wiring lines and have one-end portions facing the first wiring line and other-end portions facing the second wiring line;

a third wiring line which is connected to the one-end portions of the magneto-resistance elements, arranged apart from the first wiring line, and connected to the first connection member;

a fourth wiring line which is connected to the other-end portions of the magneto-resistance elements and arranged apart from the second wiring line;

a second connection member which is connected to the fourth wiring line and extends through the second through hole at an interval from the first wiring line;

a first contact fringe which is arranged apart from the first wiring line in the first through hole; and a second contact fringe which is arranged apart from the first wiring line in the second through hole.

35. A semiconductor device comprising:

a first wiring line having a first through hole;

a first connection member which extends through the first through hole at an interval from the first wiring line;

a second wiring line which is arranged apart from the first wiring line, the first wiring line running in a first direction, the second wiring line running in a second direction different from the first direction;

a first magneto-resistance element which is arranged at an intersection of the first and second wiring lines between the first and second wiring lines and has one end portion and the other end portion;

a third wiring line which is connected to the one end portion of the first magneto-resistance element and the first connection member and arranged apart from the first wiring line;

a fourth wiring line which is connected to the other end portion of the first magneto-resistance element and arranged apart from the second wiring line;

a fifth wiring line which is arranged apart from the second wiring line, runs in the first direction, and has second and third through holes;

a sixth wiring line which is arranged apart from the fifth wiring line and runs in the second direction;

a second magneto-resistance element which is arranged at an intersection of the fifth and sixth wiring lines between the fifth and sixth wiring lines and has one end portion and another end portion;

a seventh wiring line which is connected to the one end portion of the second magneto-resistance element and arranged apart from the fifth wiring line;

an eighth wiring line which is connected to the other end portion of the second magneto-resistance element and arranged apart from the sixth wiring line;

a second connection member which is connected to the third and seventh wiring lines and extends through the second through hole at an interval from the fifth wiring line;

a third connection member which is connected to the fourth and eighth wiring lines and extends through the third through hole at an interval from the fifth wiring line;

a first contact fringe which is arranged apart from the first wiring line in the first through hole;

a second contact fringe which is arranged apart from the fifth wiring line in the second through hole; and a third contact fringe which is arranged apart from the fifth wiring line in the third through hole.

36. A semiconductor device comprising:

a first wiring line having a first through hole;

a first connection member which extends through the first through hole at an interval from the first wiring line;

a second wiring line which is arranged apart from the first wiring line, the first wiring line running in a first direction, and the second wiring line running in a second direction different from the first direction;

a first magneto-resistance element which is arranged at an intersection of the first and second wiring lines between the first and second wiring lines and has one end portion and another end portion;

a third wiring line which is connected to the one end portion of the first magneto-resistance element and the first connection member and arranged apart from the first wiring line;

a fourth wiring line which is connected to the other end portion of the first magneto-resistance element and arranged apart from the second wiring line;

a fifth wiring line which is arranged apart from the second wiring line, runs in the first direction, and has a second through hole;

a sixth wiring line which is arranged apart from the fifth wiring line and runs in the second direction;

a second magneto-resistance element which is arranged at an intersection of the fifth and sixth wiring lines between the fifth and sixth wiring lines and has one end portion and the other end portion;

a seventh wiring line which is connected to the one end portion of the second magneto-resistance element and arranged apart from the fifth wiring line;

an eighth wiring line which is connected to the other end portion of the second magneto-resistance element and arranged apart from the sixth wiring line;

a second connection member which is connected to the fourth and seventh wiring lines and extends through the second through hole at an interval from the fifth wiring line;

a first contact fringe which is arranged apart from the first wiring line in the first through hole; and a second contact fringe which is arranged apart from the fifth wiring line in the second through hole.

* * * * *